(12) United States Patent
Lammers et al.

(10) Patent No.: US 12,135,358 B2
(45) Date of Patent: Nov. 5, 2024

(54) NON STEADY STATE ENERGY CELL IMPEDANCE MEASUREMENT

(71) Applicant: NXP B.V., Eindhoven (NL)

(72) Inventors: Matheus Johannus Gerardus Lammers, Nederweert (NL); Henri Verhoeven, Someren (NL); Oswald Moonen, Eindhoven (NL); Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 137 days.

(21) Appl. No.: 18/066,525

(22) Filed: Dec. 15, 2022

(65) Prior Publication Data

US 2024/0201273 A1 Jun. 20, 2024

(51) Int. Cl.
G01R 31/389 (2019.01)
G01R 31/3842 (2019.01)
G01R 31/396 (2019.01)

(52) U.S. Cl.
CPC ....... G01R 31/389 (2019.01); G01R 31/3842 (2019.01); G01R 31/396 (2019.01)

(58) Field of Classification Search
None
See application file for complete search history.

(56) References Cited

U.S. PATENT DOCUMENTS 8,680,868 B2   3/2014  van Lammeren et al.
9,046,463 B1   6/2015  Adler et al.
9,128,165 B2   9/2015  Lammers
2012/0280693 A1*  11/2012  Lammers ............. G01R 31/389
                                                                    324/430
2022/0163592 A1   5/2022  Barsukov et al.

FOREIGN PATENT DOCUMENTS

KR   101350809 B1   1/2014
WO   2022040034     2/2022

OTHER PUBLICATIONS

Wang, S., "Electrochemical impedance spectroscopy", Nature Reviews Methods Primers, Jun. 2021.
Wikipedia, "Dielectric spectroscopy" Aug. 8, 2022.
Rahat Hasan and Jonathan Scott, "Impendence Measurement of Batteries under load", IEEE Instrumentation and Measurement Technology Conference, 2019, pp. 1-4, IEEE, New York, NY.

* cited by examiner

Primary Examiner — Jas A Sanghera

(57) ABSTRACT

An apparatus and method for measuring energy cell impedance. Time sequences representing each of a repetitive signal, an orthogonal-phase-repetitive signal at the characterizing frequency, and at least one term of a power series polynomial are generated. One of a current or voltage corresponding to the repetitive signal is applied to an energy cell. Contemporaneously with the applying, measured values of a current or voltage are measured. A set of correlation values between the measured values and the generated time sequences are determined. The set of correlation values are transformed into a set of fitted coefficients of a repetitive signal component and an orthogonal-phase-repetitive signal component at a characterizing frequency. An impedance of the energy cell at the characterizing frequency is determined based on a ratio of the fitted coefficients for the orthogonal-phase-repetitive component to the repetitive signal component.

20 Claims, 15 Drawing Sheets

700

$$\begin{bmatrix} C_0 \\ M_{real} \\ M_{imag} \\ C_1 \end{bmatrix}_{fit} = \frac{1}{N} \cdot \begin{bmatrix} 1 & 0 & 0 & 0 \\ 0 & 2 & 0 & 0 \\ 0 & 0 & \frac{2(k\pi)^2}{(k\pi)^2-6} & \frac{6k\pi}{(k\pi)^2-6} \\ 0 & 0 & \frac{6k\pi}{(k\pi)^2-6} & \frac{3(k\pi)^2}{(k\pi)^2-6} \end{bmatrix} \cdot \begin{bmatrix} poly_0 \\ cos \\ sin \\ poly_1 \end{bmatrix}_{acc}$$

FIG. 7

$$L^T \cdot M = N$$

$$\begin{bmatrix} 1 & 0 & 0 & 0 & 0 \\ 0 & \frac{1}{2} & 0 & 0 & 0 \\ 0 & 0 & \frac{1}{2} & 0 & \frac{2}{(k\pi)^2} \\ 0 & 0 & \frac{-1}{k\pi} & \frac{-1}{k\pi} & 0 \\ 0 & 0 & \frac{-1}{3} & 0 & \frac{4}{45} \end{bmatrix} \xrightarrow{\text{Cholesky}} \begin{bmatrix} 1 & 0 & 0 & 0 & 0 \\ 0 & \frac{1}{\sqrt{2}} & 0 & 0 & 0 \\ 0 & 0 & \frac{1}{2}\sqrt{2} & 0 & 0 \\ 0 & 0 & \frac{-\sqrt{2}}{k\pi} & \sqrt{\frac{1}{3}-\frac{2}{(k\pi)^2}} & 0 \\ 0 & \frac{2\sqrt{2}}{(k\pi)^2} & 0 & 0 & \sqrt{\frac{4}{45}-\frac{8}{(k\pi)^4}} \end{bmatrix} \cdot \begin{bmatrix} 1 & 0 & 0 & 0 & 0 \\ 0 & \frac{1}{\sqrt{2}} & 0 & 0 & \frac{2\sqrt{2}}{(k\pi)^2} \\ 0 & 0 & \frac{1}{2}\sqrt{2} & 0 & 0 \\ 0 & 0 & 0 & \frac{-\sqrt{2}}{k\pi} & 0 \\ 0 & 0 & 0 & \sqrt{\frac{1}{3}-\frac{2}{(k\pi)^2}} & \sqrt{\frac{4}{45}-\frac{8}{(k\pi)^4}} \end{bmatrix}$$

$$B = (M^T M)^{-1} = \frac{1}{N} \cdot \underbrace{\begin{bmatrix} 1 & 0 & 0 & 0 & 0 \\ 0 & \sqrt{2} & 0 & 0 & \frac{-4}{(k\pi)^2}\sqrt{\frac{4}{45} - \frac{8}{(k\pi)^4}} \\ 0 & 0 & \sqrt{2} & \frac{2}{k\pi}\sqrt{\frac{1}{3} - \frac{2}{(k\pi)^2}} & 0 \\ 0 & 0 & 0 & \sqrt{\frac{1}{3} - \frac{2}{(k\pi)^2}} & 0 \\ 0 & 0 & 0 & 0 & \sqrt{\frac{4}{45} - \frac{8}{(k\pi)^4}} \end{bmatrix}}_{U \;\; 1110} \cdot \underbrace{\begin{bmatrix} 1 & 0 & 0 & 0 & 0 \\ 0 & \sqrt{2} & 0 & 0 & 0 \\ 0 & 0 & \sqrt{2} & 0 & 0 \\ 0 & 0 & \frac{2}{k\pi}\sqrt{\frac{1}{3} - \frac{2}{(k\pi)^2}} & \sqrt{\frac{1}{3} - \frac{2}{(k\pi)^2}} & 0 \\ 0 & \frac{-4}{(k\pi)^2}\sqrt{\frac{4}{45} - \frac{8}{(k\pi)^2}} & 0 & 0 & \sqrt{\frac{4}{45} - \frac{8}{(k\pi)^2}} \end{bmatrix}}_{U^T \;\; 1120}$$

$$\underline{1200} \quad B = \frac{1}{N} \cdot \underbrace{\begin{bmatrix} 1 & 0 & 0 & 0 \\ 0 & \sqrt{2} & 0 & 0 \\ 0 & 0 & \sqrt{2} & 0 \\ 0 & 0 & 0 & \frac{2}{k\pi}\sqrt{\frac{1}{3} - \frac{2}{(k\pi)^2}} \\ 0 & 0 & 0 & \sqrt{\frac{1}{3} - \frac{2}{(k\pi)^2}} \end{bmatrix}}_{U} \cdot \underbrace{\begin{bmatrix} 1 & 0 & 0 & 0 & 0 \\ 0 & \sqrt{2} & 0 & 0 & 0 \\ 0 & 0 & \sqrt{2} & 0 & 0 \\ 0 & 0 & 0 & \frac{2}{k\pi}\sqrt{\frac{1}{3} - \frac{2}{(k\pi)^2}} & \sqrt{\frac{1}{3} - \frac{2}{(k\pi)^2}} \end{bmatrix}}_{U^T}$$

$$\rightarrow B = \frac{1}{N} \cdot \begin{bmatrix} 1 & 0 & 0 & 0 \\ 0 & 2 & 0 & 0 \\ 0 & 0 & \frac{2(k\pi)^2}{(k\pi)^2 - 6} & \frac{6k\pi}{(k\pi)^2 - 6} \\ 0 & 0 & \frac{6k\pi}{(k\pi)^2 - 6} & \frac{3(k\pi)^2}{(k\pi)^2 - 6} \end{bmatrix} \quad \underline{1210}$$

FIG. 13

$$\underline{1300} \quad B = \frac{1}{N} \cdot \begin{bmatrix} 1 & 0 & 0 & 0 & 0 \\ 0 & \frac{2(k\pi)^4}{(k\pi)^4 - 90} & 0 & 0 & \frac{-45(k\pi)^2}{(k\pi)^4 - 90} \\ 0 & 0 & \frac{2(k\pi)^2}{(k\pi)^2 - 6} & \frac{6k\pi}{(k\pi)^2 - 6} & 0 \\ 0 & 0 & \frac{6k\pi}{(k\pi)^2 - 6} & \frac{3(k\pi)^2}{(k\pi)^2 - 6} & 0 \\ 0 & \frac{-45(k\pi)^2}{(k\pi)^4 - 90} & 0 & 0 & \frac{4}{45} \cdot \frac{(k\pi)^4}{(k\pi)^4 - 90} \end{bmatrix}$$

NON STEADY STATE ENERGY CELL IMPEDANCE MEASUREMENT

BACKGROUND

Field

The present invention generally relates to the monitoring of energy cells and, more particularly, relates to measuring complex impedance and related characteristics of various energy cells.

Related Art

Monitoring various states of an energy cell, such as the state of health (SoH) and other parameters of an energy cell, such as a battery cell or a plant-microbial fuel cell, are able to be determined or estimated based on measurements of the present complex impedance response of the energy cell during application of a periodic signal that varies over a range of frequencies. Determining such characteristics of an energy cell becomes more difficult with decreasing frequencies, e.g., between 1 Hz and 1 µHz. Impedance measurements at such low frequencies are complicated by the fact that measurement accuracy is degraded by variations in the operating point of the energy cell, e.g., the cell's current or voltage, over the sometimes long time periods that such low frequency periodic signal measurements are made. For example, 12 days are required to measure one cycle of a 1 µHz signal, resulting in 36 days being required to measure three cycles of such a periodic frequency. Such long measurement times are used, for example, to get past the energy cell's transient response prior to making measurements. In the example of three cycles, the first two cycles allow for cell run-in and the third cycle is used to measure cell response.

In an example of making such measurements of an energy cell, Electro-chemical Impedance Spectroscopy (EIS) is performed by injecting sinusoidal currents over a range of frequencies, referred to as Galvano-stat measurement, or injecting periodic signals, such as sinusoidal or other periodic waveform voltages, over a range of frequencies, referred to as Potentio-stat measurements, at a chosen voltage/current operating point of the energy cell, and then measuring the associated cell voltages or currents, respectively. The amplitude ratio and phase difference between injected and measured voltage and current determines the magnitude and phase angle of the impedance of the energy cell at each frequency. Typically, the EIS measurements are visualized in a Nyquist plot where the negative imaginary part of the impedance is plotted in the upwards direction of the vertical axis.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 7 illustrates an example of a 4×4 $B=(M^TM)^{-1}$ matrix equation for a characterization polynomial up to first order, according to an example.

FIG. 10 illustrates an $M^T \cdot M$ Cholesky decomposition performed for up to a second order polynomial, according to an example.

FIG. 11 illustrates an upper triangle matrix calculation, according to an example.

FIG. 12 illustrates a Matrix $B=(M^TM)^{-1}$ matrix equation for a polynomial up to first order as is shown in FIG. 7, according to an example.

FIG. 13 illustrates a $B=(M^TM)^{-1}$ matrix equation result for a polynomial up to second order, according to an example.

DETAILED DESCRIPTION

Figure 1:
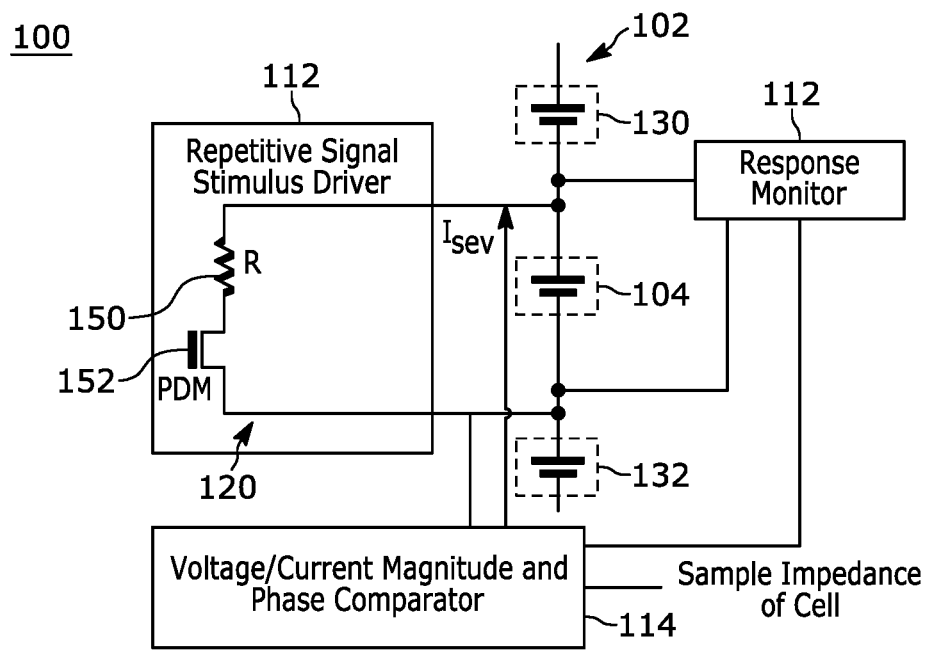
FIG. 1 illustrates a simplified energy cell complex impedance measurement apparatus block diagram, according to an example.

The below systems and methods operate to perform measurements to determine complex impedance and related parameters for energy cells, such as battery cells or Plant-Microbial Fuel Cells (P-MFC). A value of the present complex impedance value of such energy cells is able to be used for a number of purposes, such as determining the state of charge (SoC) and other parameters, such as internal temperature, and characteristics of that energy cell.

A process referred to as cell balancing is an example of an application that is able to incorporate processing within a cell balancing circuit to efficiently reuse that circuit to inject electrical current into the cell to thereby determine an energy cell's complex impedance to support processing that determines the energy cell's SoC and other parameters. Cell balancing in some examples is performed in battery packs with many cells in series to ensure all cells are equally charged in to maintain the health of the battery pack. In one example, each energy cell in a string of series connected energy cells is able to have its own cell balancing circuit to improve the charging and discharging operations of that energy cell. Such cell balancing circuits are able to operate to equalize the SoC of all of the series-coupled cells. By balancing the SoCs of the cells during various operational conditions, such as at rest, during charging or during discharging, cells may be prevented from becoming overcharged or over-discharged.

Practical considerations involved in operating a series-connected string of energy cells are sometimes addressed by including various circuits such as a balancing circuit. For example, a series-connected string of energy cells all have the same amount of current flowing through them when they are being charged or discharged. In an ideal situation, all the cells would be at the same SoC after charging or discharging. There are, however, often mismatches between energy cells such as having different susceptibility to leakage current, differences between cell capacities, and efficiency of converting current into chemically stored energy. Therefore, the SoCs of the individual energy cells that are connected in series may not all be the same and can drift apart over time as they are charged and discharged. If no action is taken, the differences may grow with each charge/discharge cycle, which can lead to a reduction of the useable battery capacity and life time.

Such differences in SoCs can cause a battery cell to be over-discharged during use or over-charged in the charging process. For some battery chemistries, such as lithium-ion based batteries, over-charging or over-discharging may damage the battery cell. For example, a fully charged lithium ion cell often has a voltage that is close to the electrolyte breakdown threshold voltage at which damage to the cell may occur. If a cell is over-charged to the point where the voltage exceeds the electrolyte breakdown threshold voltage, the cell may be damaged. To prevent such damage, battery packs of series-coupled cells often include cell-balancing circuits that equalize the SoCs between the series-coupled cells. By balancing the SoCs of the cells at rest, during charge or discharge, cells may be prevented from becoming over-charged or over-discharged.

Cell balancing in many cases is based on making all voltages of the cells equal, under the assumption that an equal voltage corresponds to an equal SoC. Impedance of the energy cell(s) (and the way its impedance changes over time) is a basis for more accurately estimating the SoC, state of function (SoF) and the SoH of the energy cell. Determined values of impedance in some instances are also able be used to determine, for example, better or optimal charge and discharge strategies to maximize battery life, cycle life, and better utilize the available energy storage capacity of the battery pack.

A technique used to measure the impedance of an energy cell is electro-chemical impedance spectroscopy (EIS), hereafter generally referred to as electroscopy. Electroscopy in an example operates to determine the impedance of an energy cell over a range of frequencies. In an example, a current or voltage source is used to apply a periodic stimulus signal by one of either driving, for example, a sinusoidal or other periodic waveform current through the energy cell, or applying a sinusoidal, or other periodic waveform, voltage across the energy cell, and then measuring the response of the cell to that stimulus signal. The response signal is a voltage signal in the case of a stimulus signal that is a current signal, or a current signal in the case of a stimulus signal that is a voltage signal. The stimulus signal is generally applied at a low amplitude relative to the operational currents and/or voltages of the energy cell. Applying such a signal with a relatively low amplitude allows the monitoring to assume the energy cell exhibits a mostly linear response to the applied stimulus current or voltage, i.e., the energy cell is assumed to be operating as a small signal linear circuit element during the measurements in order to satisfy the superposition principle. In other words the responding voltage or current should also produce a pure sinusoidal wave without the presence of any significant higher harmonics.

The complex impedance of an energy cell is determined in some examples by applying a sinusoidal stimulus signal at a number of different frequencies to more fully characterize the complex impedance of the energy cell over a frequency range of interest. Various types of energy cells incorporate chemical reactions that have time constants that can range from milliseconds to many seconds. In order to capture the relevant information of these chemical reactions that is used to support determining various states of such energy cells, measurements in some examples are made by applying a sequence of periodic signals with different frequencies that cover the relevant ranges of those time constants. In an example, stimulus signals are generated at a single frequency at a time for each complex impedance measurement, and a sequence of stimulus signals at different single frequencies are generated to cover the frequency range of interest for complex impedance measurements. The frequency at which the stimulus signal is generated is referred to herein as a characterizing frequency. The response signal across the energy cell has a sinusoidal component at the same frequency as the stimulus signal but differs in amplitude and phase based on the complex impedance of the energy cell.

Measuring the complex impedance of an energy cell, such as a battery cell or plant-microbial fuel cell, becomes more difficult with decreasing frequencies due to changes in the operating point of the energy cell that may occur over a longer duration. For example, the energy cell being measured may appreciably charge or discharge over a duration used to measure lower frequency impedance characteristics, such as impedance characteristics over the range of 1 Hz to 1 µHz. In an example of accurately performing impedance measurements of an energy cell at lower frequencies using conventional techniques, the response voltage or current of the operating point of the energy cell being measured would have to be kept constant over the relatively long period of time that stimulus voltage or current is applied during such low frequency measurements. As discussed above, measurements are made by applying stimulus voltages or current over time durations that can range from 1 second up to much longer time durations, such as the above-discussed 36 days for three (3) cycles of a low frequency sinusoidal waveform. In the case of applying a stimulation signal that is a current waveform, the average voltage should not change during that entire time duration in order to achieve accurate measurements.

FIG. 1 illustrates a simplified energy cell complex impedance measurement apparatus block diagram 100, according to an example. The simplified energy cell complex impedance measurement apparatus block diagram 100 is referred to as simplified because it depicts only the repetitive signal waveform measurement components that are included in more complete examples of the below-described systems and methods.

The simplified energy cell complex impedance measurement apparatus block diagram 100 depicts a string of series connected energy cells 102 that includes a first energy cell 130, a second energy cell 132 and a monitored energy cell 104. In general, one or more energy cells in such a string of series connected energy cells 102 are able to have separate monitoring equipment as is described below.

The simplified energy cell complex impedance measurement apparatus block diagram 100 depicts a repetitive signal stimulus driver 110 that provides a stimulus waveform across the monitored energy cell 104. In various examples, the repetitive signal stimulus driver 110 is able to be configured to produce a stimulus waveform that is either one of a voltage output or a current output that varies with a repetitive signal waveform at one frequency, where that can be set over a range of frequencies for different measurements. In alternative examples, any periodic, repetitive waveform, such as a square wave, pulsed waveform, other waveform, or combinations of these, is able to be applied to the monitored energy cell 104. In some examples, the repetitive signal waveform generated by the repetitive signal stimulus driver 110 is a sinusoidal waveform. The illustrated repetitive signal stimulus driver 110 depicts a stimulus current generator 120 that includes a pass transistor 152 and a series resistor 150 that are connected in parallel with the monitored energy cell 104. As shown, since the stimulus waveform is applied to the one energy cell 104, the voltage or current supplied by the repetitive signal stimulus driver 110 is only applied to that one energy cell 104.

The voltage across, or the current flowing through, the energy cell 104 is measured by a response monitor 112. In an example where the repetitive signal stimulus driver 110 provides an electrical current waveform, such as by the stimulus current generator 120, the response monitor 112 is configured to measure the voltage across the energy cell 104. In an example where the repetitive signal stimulus driver 110 provides a voltage waveform, such as by the stimulus voltage generator 122, the response monitor 112 is configured to measure the electrical current that flows through the energy cell 104. Measurement of the electrical current that flow through the energy cell 104 is able to be performed by any technique, such as by operating with a small resistor in series with the energy cell 104 and measuring the voltage across that resistor.

The voltage or current measured by the response monitor 112 is provided to a voltage/current magnitude and phase comparator 114. The voltage/current magnitude and phase comparator 114 is an example of an impedance calculator and also receives the samples of the stimulus signal generated by the repetitive signal stimulus driver 110 that was provided to the energy cell 104. In an example, the voltage/current magnitude and phase comparator 114 measures magnitude ratios and phase differences between the stimulus signal provided to the energy cell and the repetitive signal component of the measured response signal. In an example, the magnitude ratios and phase differences of these two signals are expressed in Cartesian coordinates as a real component, which is able to be represented as a correlation of the measured response signal and the stimulation signal, and what is generally referred to as an imaginary component, which is a correlation of the response signal and a copy of the stimulation signal that is ninety degrees out of phase with the stimulation signal and the response signal. These two components in Cartesian coordinates can also be represented in polar coordinates as a vector whose length corresponds to the magnitude ratio, and the vector angle relative to the positive real axis represents the phase difference.

In an example, the simplified energy cell complex impedance measurement apparatus block diagram 100 operates to determine the complex impedance of the energy cell 104 at a number of separate repetitive signal frequencies. In such an example, the repetitive signal stimulus driver 110 generates a stimulus signal at a particular frequency for a number of cycles and the voltage/current magnitude and phase comparator 114 produces values indicating the complex impedance values, such as the real and imaginary components of the complex impedance, of the energy cell that are measured at that particular frequency. The repetitive signal stimulus driver 110 is then configured to generate a repetitive signal stimulus signal at a next repetitive signal frequency within the frequency range over which the complex impedance of the energy cell 104 is to be measured. The voltage/current magnitude and phase comparator 114 then determines and produces values corresponding to the complex impedance of the energy cell 104 at that next repetitive signal frequency. This repeats in an example until the complex impedance is measured for all of the selected frequencies within the frequency range over which the complex impedance of the energy cell 104 is to be measured.

The following discussion of the below-described systems and methods refers to and describes some of the operations and measurements that are similar to the above-described simplified energy cell complex impedance measurement apparatus block diagram 100. In addition, the following description further describes additional signals that are generated and processed by examples of the below-described systems and methods.

Figure 2:
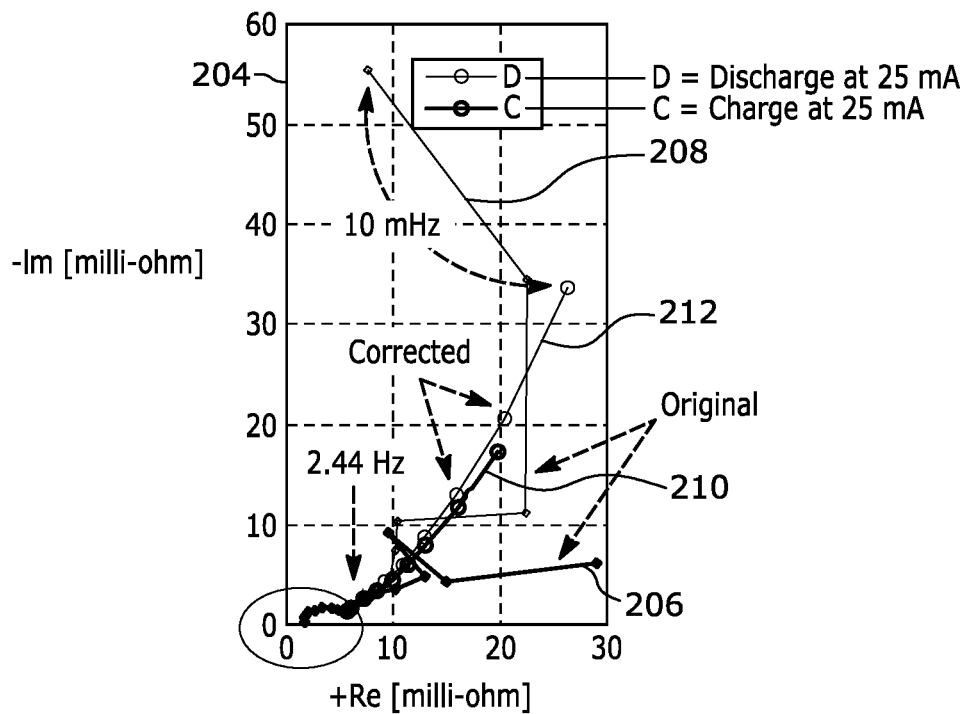
FIG. 2 illustrates a Nyquist plot of complex impedances, according to an example.

FIG. 2 illustrates a Nyquist plot of complex impedances 200, according to an example. The Nyquist plot of complex impedances 200 is an example of a plot indicating the complex impedance values measured over a range of frequencies. Typically, EIS measurements are visualized in a Nyquist plot where the negative imaginary part of the impedance is plotted in the upwards direction of the vertical axis 204 as is depicted in the Nyquist plot of complex impedances 200. The horizontal axis 202 plots the positive real component of the impedance. The Nyquist plot of complex impedances 200 depicts plots of complex impedance vs. frequency for an energy cell being measured such as by an EIS process.

The Nyquist plot of complex impedances 200 depicts four plots with two plots indicating measurements of an energy cell while the energy cell is being charged, and two plots indicating measurements of the energy cell when the energy cell is being discharged. The depicted plots include an original charging plot 206, an original discharging plot 208, a correctly measured charging plot 210 and a correctly measured discharging plot 212. Each plot includes a number of points where each point corresponds to a particular characterizing frequency at which the complex impedance of the energy cell 104 was determined based on measured data. The original charging plot 206 and original discharging plot 208 depict the determined complex impedance values that were determined in an example by a conventional EIS measurement system, such as is described above with regards to the voltage/current magnitude and phase comparator 114 of the simplified energy cell complex impedance measurement apparatus block diagram 100 while the energy cell is charging and discharging, respectively.

The original charging plot 206 and original discharging plot 208 include errors in the measurements that were made at lower frequencies where those errors are due to a DC discharge current of 25 mA of the energy cell 104, causing the energy cell to not have a constant operating point, e.g., the cell voltage is not constant during this measurement. Errors in the measurements and determined quantities are influenced by the data measurement technique and the impact of frequency domain characteristics caused by the finite time duration measurements that are made. In calculating impedance values based on a finite sample time duration, analysis in the frequency domain, such as performing Discrete Fourier Transforms (DFTs), treats the samples seen within the finite sample time window as infinitely repeating outside that finite sample time window. Calculations in the frequency domain are based on an assumption that the signal observed during the sampling interval represents an infinite time duration signal where the signal within the measurement interval infinitely repeat in both directions outside that measurement interval. In the case of the energy cell voltage dropping due to a discharge current, the component of that dropping voltage will appear to be a sawtooth voltage pattern in frequency domain analyses with a cycle time equal to the measurement time duration. In this case, the measured cell voltage response can be decomposed into two superimposed signals, a repetitive signal component that corresponds to the repetitive signal stimulus signal, and a sawtooth component due to the voltage drop caused by the discharge current.

The correctly measured charging plot 210 and correctly measured discharging plot 212 depict plots of the complex impedance at the measured frequency points during charging and discharging, respectively, where the contribution of the sawtooth has been removed. The differences between the original and corrected plots is small at higher frequencies, such as above 1 Hz, but the differences increase as frequencies drop below 1 Hz and the points appear to scatter randomly at the lower frequencies. An example of processing to obtain the correct plots is described below.

Figure 3:
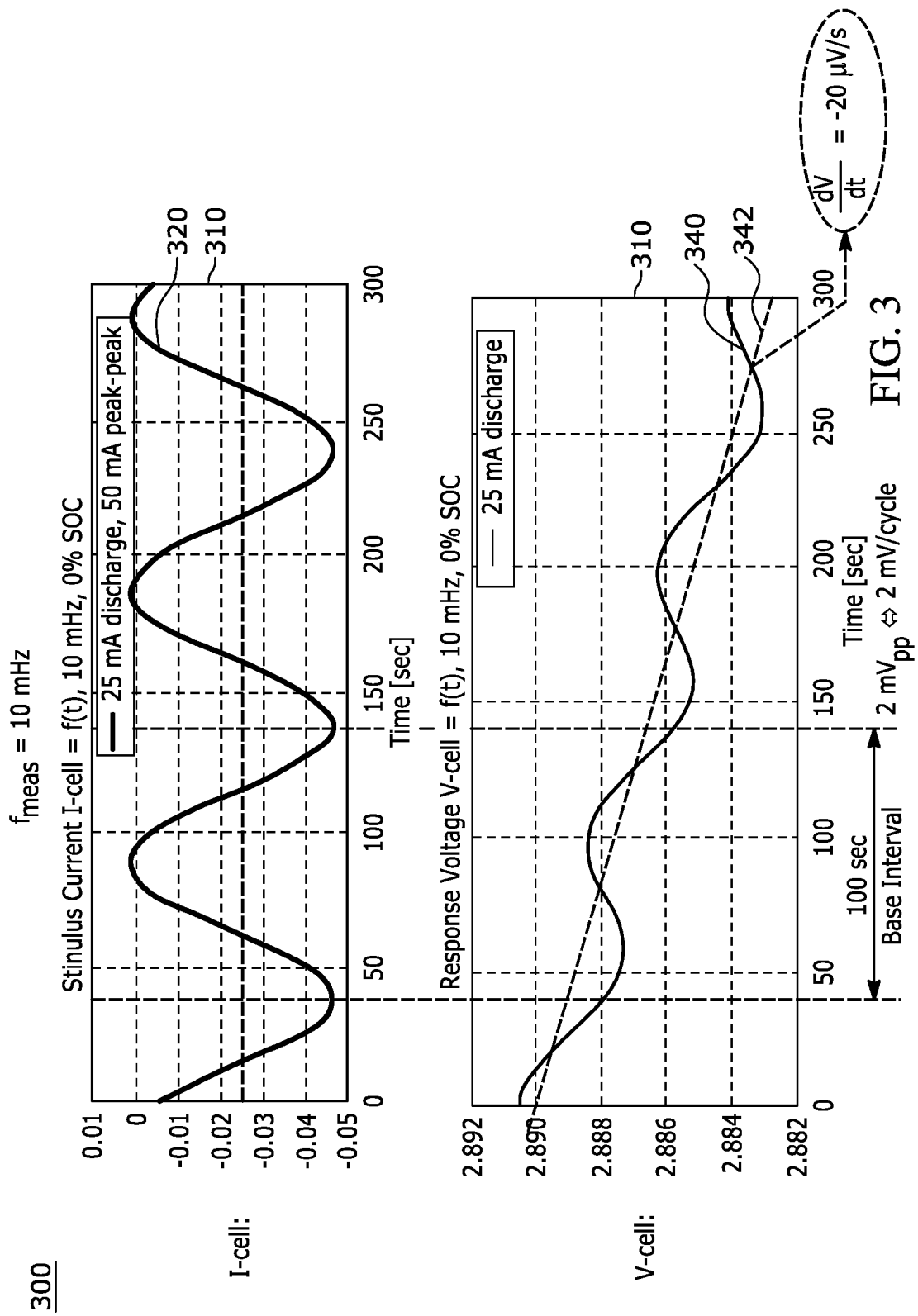
FIG. 3 illustrates an instance of low frequency (10 milliHz) stimulus current and voltage response waveforms, according to an example.

FIG. 3 illustrates an instance of low frequency stimulus current and voltage response waveforms 300, according to an example. The low frequency stimulus current and voltage response waveforms 300 depict the electrical current waveform that comprises the low frequency stimulus waveform 310, and the voltage waveform that comprises the low frequency response waveform 312 that is the measured voltage across an energy cell to which the electrical current stimulus waveform is applied. The low frequency stimulus current and voltage response waveforms 300 depict a sinusoidal electrical current stimulus signal 320 of 10 milliHz (mHz) at 50 mA peak-to-peak being injected into the energy cell being measured, to perform Galvano-stat measurements, while that energy cell is being discharged with a DC current of 25 mA. The low frequency stimulus current and voltage response waveforms 300 further depict the measured low frequency response voltage 340, such as is measured by the response monitor 112 discussed above. The measured low frequency response voltage 340 includes a sinusoidal component that corresponds to the sinusoidal electrical current stimulus signal 320, and also includes a low frequency linear slope component 342 that is illustrated by a dashed line. The low frequency linear slope component 342 in this example corresponds to the voltage change across the energy cell 104 due to the 25 mA discharge current being drawn during the measurement time duration of 300 seconds. As is shown, the slope of this low frequency linear slope component 342 is −20 µV/second, or 2 mV/cycle, for the 10 mHz waveform in comparison to the 2 mV peak-to-peak value of the sinusoidal voltage response.

Figure 4:
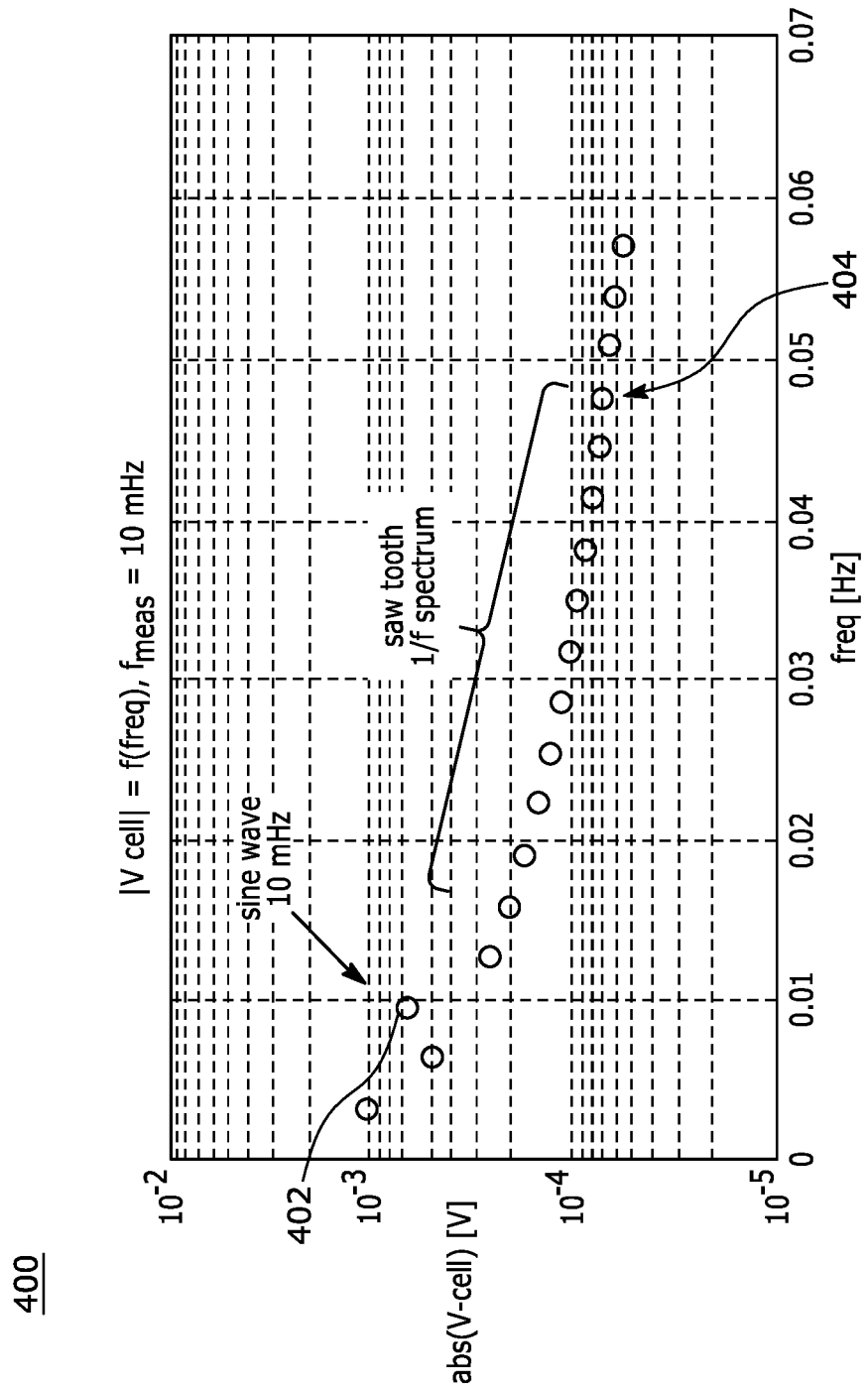
FIG. 4 illustrates a measured response voltage frequency spectrum, according to an example.

FIG. 4 illustrates a measured response voltage frequency spectrum 400, according to an example. The measured response voltage frequency spectrum 400 depicts the results of a fast Fourier transform (FFT) that was calculated over the complete data set of the above-described measured low frequency response voltage 340, which has a duration of 300 seconds, i.e., 3 cycles of 10 mHz. As shown, the measured response voltage frequency spectrum 400 includes a stimulus signal frequency component 402 of 10 mHz, which corresponds to the sum of the sinusoidal waveform and third harmonic of the sawtooth magnitude in the measured low frequency response voltage 340. In addition to the stimulus signal frequency component 402, a number of additional frequency components 404 are also included in the measured response voltage frequency spectrum 400. These additional frequency components 404 correspond to the 1/frequency spectral envelope of the sawtooth-like waveform corresponding to the above-described low frequency linear slope component 342. The presence of the sawtooth-like waveform induces errors in the impedance measurements made by processing the measured response signal. For example, the relatively large magnitude and phase of the third harmonic of the additional frequency components 404 that correspond to the sawtooth spectrum, in comparison with the magnitude of the stimulus signal frequency component 402, falls on the same frequency as the stimulus signal frequency component 402 and interfere with the impedance calculation and leads to erroneous results such as those visible in the original discharging plot 208 of the Nyquist plot of complex impedances 200.

Figure 5:
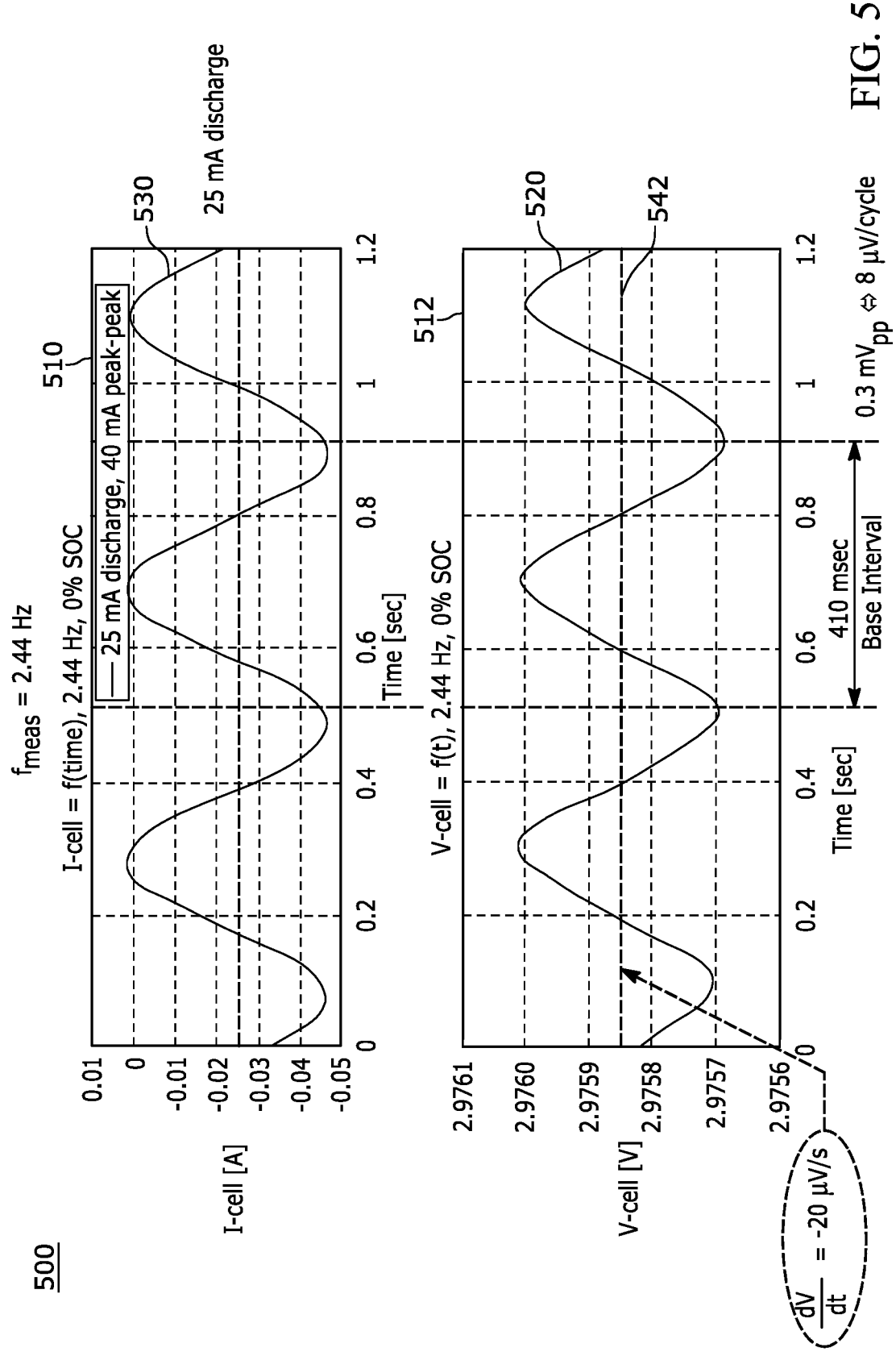
FIG. 5 illustrates an instance of high frequency 2.44 Hz stimulus current and voltage response waveforms, according to an example.

FIG. 5 illustrates an instance of a high frequency 2.44 Hz stimulus current and voltage response waveforms 500, according to an example. The high frequency 2.44 Hz stimulus current and voltage response waveforms 500 depicts a high frequency stimulus signal 510 and a high frequency response signal 512 that is the measured voltage across an energy cell to which the electrical current stimulus waveform is applied. The high frequency stimulus signal 510 depicts a high frequency sinusoidal electrical current stimulus signal 530 of 2.44 Hz that is injected into the energy cell at 40 mA peak-to-peak, to perform Galvano-stat measurements. The high frequency response signal 512 depicts a high frequency response sinusoidal waveform 520, which is a measured voltage across an energy cell based on the high frequency sinusoidal electrical current stimulus signal 530. In this example, the energy cell is also being discharged with a DC current of 25 mA as was the case depicted in the low frequency stimulus current and voltage response waveforms 300 discussed above.

The high frequency response sinusoidal waveform 520 includes a high frequency sinusoidal component that corresponds to the high frequency sinusoidal electrical current stimulus signal 530, and also includes a high frequency linear slope component 542, which is depicted by the dotted line and that corresponds to the voltage change across the energy cell 104 due to the 25 mA discharge. As is shown, the slope of the high frequency linear slope component 542 is also −20 µV/second as is observed above for the low frequency stimulus current and voltage response waveforms 300. Due to the higher frequency of the stimulus signal, the high frequency linear slope component has a slope of −8 µV/cycle for the 2.44 Hz waveform in comparison to the 0.3 mV peak-to-peak of the voltage response. The better correspondence between the original discharging plot 208 and the correctly measured discharging plot 212 of the Nyquist plot of complex impedances 200 at higher frequencies is due to this smaller slope, per sinusoidal signal cycle, which corresponds to the lower amplitude of the sawtooth wave in this case, relative to the sinusoidal components at higher frequencies. The larger proportional slope per cycle for lower frequencies induces a greater error as is also noted above with respect to the Nyquist plot of complex impedances 200.

The methods and systems described below operate to determine the phase and amplitude of the sinusoidal response waveform and to also determine other components contained within the measured response waveform that are caused by factors other than the stimulus waveform. In an example as is described in further detail below, the measured waveforms across an energy cell being measured are correlated with two sets of signals. The first set of signals includes sinusoidal waveforms that are 1) in-phase with, and 2) orthogonal to, the sinusoidal stimulus waveform. The second set of signals includes one or more time sequences where each time sequence defines a waveform that spans the measurement period for the measured response waveform and that corresponds to a respective component of a power series polynomial. In general, the phrase "time sequence"

refers to either an analog signal with the described time characteristic or a set of discrete time samples.

The values of the correlations of the measured signal and the signals within the first set of signals and the second set of signals are referred to herein as components of a "fit function." A fit function in this context defines a time function that is fitted to the combination of the sinusoidal stimulus waveform and the sum of the power series polynomial terms that is superimposed onto the sinusoidal waveform of the response signal. An example of such a fit function will fit a sum of a sinusoidal waveform and a sawtooth waveform that corresponds to the measured low frequency response voltage 340 depicted in the low frequency stimulus current and voltage response waveforms 300, where the low frequency linear slope component 342 corresponds to the voltage drop across the energy cell due to a constant DC current draw. The power series polynomial in this example approximates the drift over time of the non-steady state operating point. In an example, a least squares fitting method is used to approximate the coefficients of a fit function by minimizing the sum of the squares of the residuals, being the difference between the measured and fitted values. The number of components in the power series polynomial in various examples is able to be selected to match the expected complexity of the superimposed signal or to match components of signals that are superimposed on the sinusoidal response signal that reflect various properties of interest in the energy cell 104. Separating out components of the measured response signal that are not related to the stimulus signals, such as voltage drops due to discharging of the energy cell, allows for the removal of frequency components of those signals that coincide with the frequencies of the injected sine/cosine signals of interest and that would otherwise interfere with impedance calculations.

The below-described systems and methods generate and inject one of sinusoidal currents, referred to as Galvano-stat, or voltages, referred to as Potentio-stat, into an energy cell such as a battery cell, plant-microbial fuel cell, other energy cell, or combinations of these. These sinusoidal currents or voltages are generated at selected frequencies over a range of frequencies, such as, without limitation, typically 1 µHz to 10 kHz, in order to measure the complex impedance response of the energy cell over that range of frequencies. This technique is known as electro-chemical impedance spectroscopy (EIS). While these stimulus signals are generated and injected into the energy cell, a response signal, corresponding to a measured response voltage or measured response current, respectively, is measured across or through the energy cell.

The measured cell voltages, in the Galvano-stat case, or currents in the Potentio-stat case, are correlated with a number of generated components. The measured values are multiplied in an example by respective time sequences representing each of these generated components to create a number of multiplied value sequences. Each of the number of multiplied value sequences are accumulated, by adding them together, over an integer number of measurement cycles of the sinusoidal stimulus waveform. In an example, the generated components are generated contemporaneously with the stimulation of the energy cell and those generated components are provided to circuitry to perform the above described multiplication. The generated components values in an example include:

1) Sine and cosine values of the injected frequency of interest, i.e., the sinusoidal stimulus signal; and
2) Values of a number of polynomial terms of a power series up to a predefined order (e.g. DC, linear, quadratic, etc.) that correspond to a curve of that order that extends over a measurement duration that, in an example, is selected in an example to equal an integer number of measurement cycles of the sinusoidal stimulus waveform.

A set of accumulated values of the correlation of these generated signals with the measured response signals from the energy cell is computed over the measurement duration, which is equal to the integer number of cycles of the sinusoidal stimulus waveform.

When the accumulation of the integer number of cycles is complete, the resulting terms in an example are multiplied with a pre-calculated matrix to determine the fitted values corresponding to the terms of the generated components. As is described in further detail below, this pre-calculated matrix in one example is a square and symmetric matrix of the same dimension as the number of accumulated terms.

The fitted values of the generated components in an example have the following relationships:
 The result that corresponds to the sine signal (the signal 90 degrees out of phase with the stimulation waveform) relates to imaginary part of the impedance;
 The result that corresponds to the cosine signal (the signal that is in-phase with the stimulation waveform) relates to real part of the impedance; and
 The results that correspond to the terms of the power series polynomial up to the number of polynomial terms that were generated and correlated with the measurement waveform relate to other signals present in the response waveform that are not a linear response to the stimulus waveform, such as due to energy cell discharge, other causes, or combinations of these.

Depending on the number of chosen polynomial terms that were selected to be generated, these results are able to include, e.g., the DC component of the response waveform, the slope component of a superimposed waveform over the waveform that is in response to the stimulation waveform, a quadratic of that superimposed waveform, and higher order components of that superimposed waveform.

The below described systems and methods in some examples include the following general features.

Full frequency range EIS measurements of battery and plant-microbial fuel cells without requiring a steady operating point for a long period of time to, e.g., acquire the SoH.

Acquiring the coefficients of a power series polynomial that represent the current or voltage drift during EIS measurements, especially of interest for the lower frequency part of the impedance measurement.

Measuring impedances while charging or discharging battery cells in order to safeguard the cell operating properties (e.g., can be used as an early warning system).

Resistive bleeders for cell balancing in large battery packs can be adapted in an example to be reused, as is understood by persons of ordinary skill in the relevant arts in light of the present discussion, to inject sinusoidal currents via pulse density modulation (PDM). Despite the introduced discharge current, accurate full frequency range EIS measurements can be executed to, e.g., acquire SoH.

Figure 6:
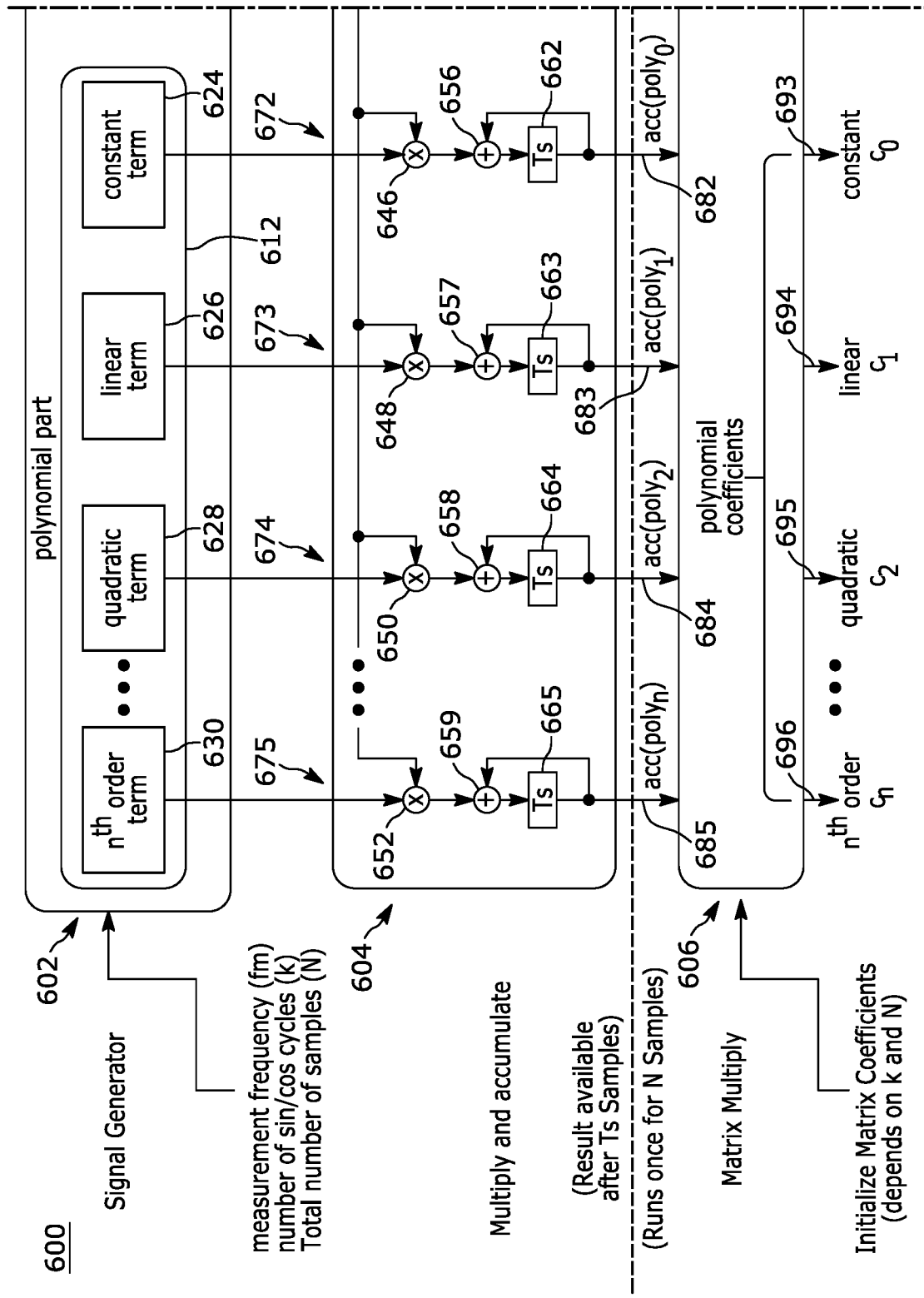
FIG. 6 depicts an impedance measurement system block diagram, according to an example.
Figure 6:
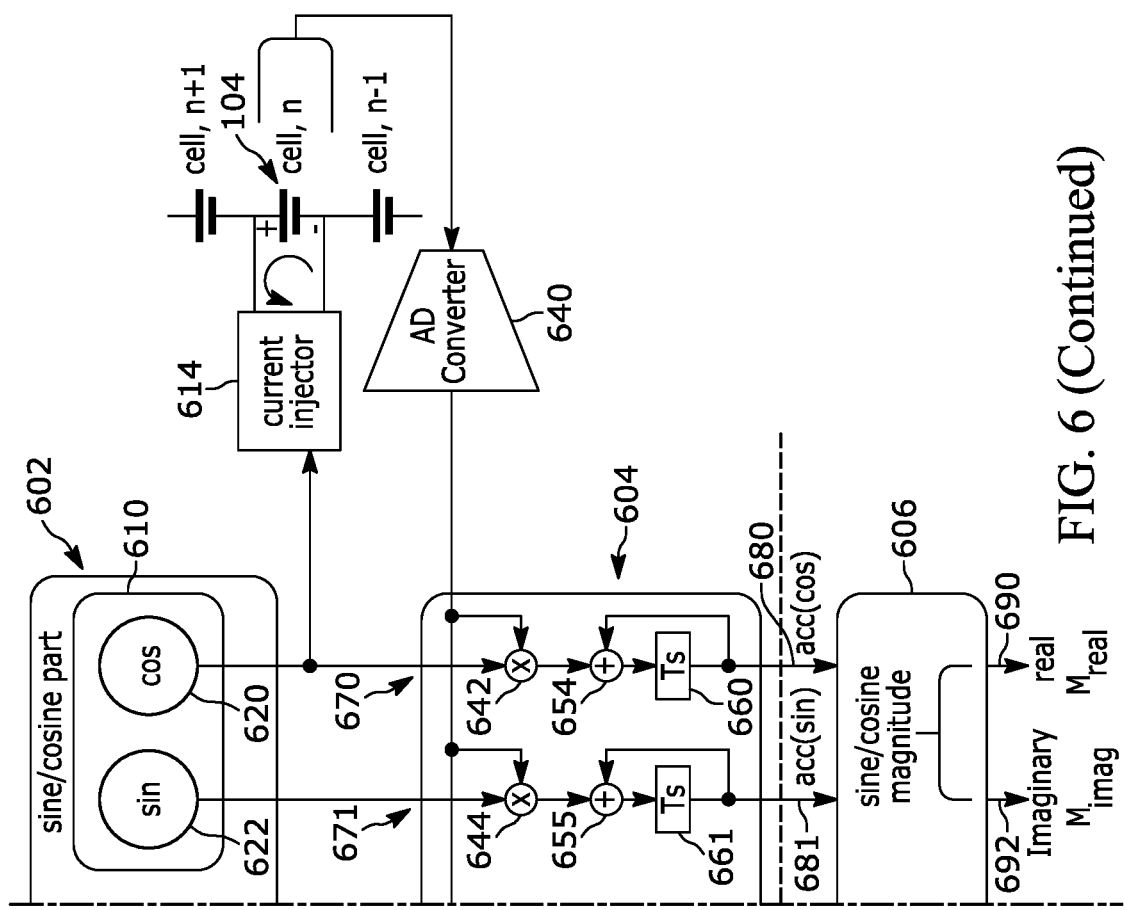

FIG. 6 depicts an impedance measurement system block diagram 600, according to an example. The impedance measurement system block diagram 600 depicts an example of a Galvano-stat measurement system. In a Galvano-stat measurement system, a sinusoidal current is injected into an energy cell and the voltage across that energy cell is measured by an Analog to Digital (A-to-D) converter 640, which is an example of a signal measurement component. The impedance measurement system block diagram 600 depicts a digital implementation of an apparatus that performs the described processing. In further examples, corresponding circuits are able to be realized that partially or fully implement the below-described processing using analog techniques. The below-described principles are applicable to Potentio-stat measurements wherein a sinusoidal voltage is applied across an energy cell, and a suitable signal measurement component is able to measure the resulting current variation through the energy cell as a response waveform.

In an example, circuits implementing the impedance measurement system block diagram 600 are able to be included in any suitable device that is able to be electrically attached to an energy cell. In one example, such a circuit is able to be implemented as part of a resistive battery bleeder circuit that is connected to various energy cells for various purposes. The below description describes complex impedance measurements, and measurements of other parameters, at a particular characterizing frequency. The more complete characterization of an energy cell includes performing the below described complex impedance measurements, and determination of other parameters, over a range of frequencies and that the below described processing for one characterizing frequency is able to be repeated at a number of different characterizing frequencies within a frequency range of interest.

The impedance measurement system block diagram 600 in an example operates by sequentially providing a number of sinusoidal stimulus signals at each of a different measurement frequency, referred to herein as a characterization frequency, over a range of measurement frequencies in order to characterize the complex impedance of an energy cell. The impedance measurement system block diagram 600 includes three major subsystems, a signal generator 602, a multiply and accumulate block 604, and a matrix multiply block 606.

The signal generator 602 includes two signal generator parts. A first signal generator part is a sine/cosine part 610, and a second signal generator part is a power series polynomial part 612. These two parts in this example both produce on-the-fly samples of all terms of a number of model signals at a sample rate ($T_s$) to support the discrete time processing described below. In alternative examples, analog circuitry implementing corresponding processing is also able to be used to realize the benefits of the described systems and methods. The sine/cosine part 610 includes a cosine generator 620 and a sine generator 622 that each produce a time sequence of discrete time samples of model signals that include a time sequence of a co-sinusoidal signal, i.e., a cosine wave, at a characterizing frequency, and a time sequence of a sinusoidal signal, i.e., a sine wave, that is also at the characterizing frequency but is ninety degrees out of phase with the co-sinusoidal signal. The sinusoidal signal and co-sinusoidal signal are generated at what is referred to as a characterizing frequency, which is the frequency at which the complex impedance of the energy cell is being measured. The power series polynomial part 612 in the depicted example includes a number, e.g., the illustrated number "n," of generators that each generates a time sequence of samples of signals of model signals that each corresponds to a particular term of a power series polynomial that is an exponential series, as is described in further detail below. The power series polynomial part 612 in an example generates at least one time sequence corresponding to a respective term of a power series polynomial where each respective term of the power series polynomial has a respective exponential value.

In alternative examples, any repetitive waveform is able to be generated by the first generator part instead of the described sine and cosine waveforms. For example, square waves, triangular waves, pulsed waveforms, other repetitive waveforms, or combinations of these are able to be generated and used in place of, or in addition to, the described sine and cosine waves. The sine wave generated by the sine generator 622 of the illustrated example is an example of a repetitive signal at a characterizing frequency, and the cosine wave generated by the cosine generator 620 in the illustrated example is an example of an orthogonal-phase-repetitive signal at the characterizing frequency that is ninety degrees out of phase with the repetitive signal.

For each particular characterizing frequency, or measuring frequency ($f_m$), for which a stimulus signal is to be generated and responses measured, the two parts of the signal generator each produces a total of N samples for each generated signal that extend over a time duration over which impedance measurements are to be made at each particular measuring frequency ($f_m$). In an example, the number "N" is chosen based on the particular measuring frequency ($f_m$) and the number of wave cycles (k) of the sinusoidal/co-sinusoidal signals at that measuring frequency ($f_m$) that are to be used for the complex impedance measurement. The cosine generator 620 and the sine generator 622 each produces discrete time samples for that number of wave cycles (k) at the measuring frequency $f_m$ such that the produced time samples complete an integer number k of full wave cycles within the N samples, such that $$k = \frac{N}{N_{sin,cos}}$$

is an integer.

The power series polynomial part 612 includes a number of polynomial component generators that each generates a time sequence of samples for the terms of a power series polynomial of a degree determined by the number of polynomial component generators. The depicted power series polynomial part 612 shows a constant term generator 624 that generates a time sequence of a constant value, a linear term generator 626 that generates a linear time sequence of samples that increases linearly with sample count, a quadratic term generator 628 that generates a quadratic time sequence of samples that increases with sample count squared, and an $n^{th}$ order term generator 630 that generates an $n^{th}$ order time sequence of samples that increases with sample count to the $n^{th}$ power. Ellipses indicate that an arbitrary number of additional generators are able to be included in various examples.

The A-to-D converter 640 digitizes the cell voltage at the sample rate ($T_s$) to produce a time sequence of samples of the response waveform. The A-to-D converter 640 produces, in an example, contemporaneously with applying a sinusoidal stimulus signal by the cosine generator 620 that is one of an electrical current or an electrical voltage, a time sequence of measured values of a response waveform corresponding to another of the electrical current or the electrical voltage across the energy cell.

The multiply and accumulate block 604 is an example of a correlation processor and includes a number of discrete time multiply and accumulate processing elements. As is described below, the multiply and accumulate block 604 performs a correlation computation between the time sequence of samples of the measured response waveform produced by the A-to-D converter 640 and the time samples produced by each generator in the signal generator 602. The multiply and accumulate block 604 produces a number of accumulated values that each corresponds respectively to the generated time sequences of values that are generated by the generators of the signal generator 602. The produced accumulated values in an example are then further processed as is described in further detail below.

The depicted multiply and accumulate block 604 has one multiply and accumulate string for each generator within the signal generator 602. As shown, the depicted multiply and accumulate block 604 includes a cosine string 670, a sine string 671, a constant term string 672, a linear string 673, a quadratic string 674, and an $n^{th}$ order string 675. Ellipses depict that an arbitrary number of strings may be included in various examples. In an example, the number of strings corresponds to the number of generators in the signal generator 602.

Using the cosine string 670 as an example, the cosine string 670 includes a cosine multiplier 642 that receives the time sequence of samples of the cosine signal produced by the cosine generator 620 and the time sequence of samples generated by the A-to-D converter 640. For each received sample representing time sample q, the $q^{th}$ sample from the cosine generator 620 and the $q^{th}$ sample of the time sequence produced by the A-to-D converter 640 are multiplied by the cosine multiplier 642 and this $q^{th}$ output of the cosine multiplier 642 is provided to a cosine summer 654. The cosine summer 654 provides its output to a cosine time delay element 660. The cosine time delay element 660 receives that discrete time sample at its input, and produces that value at its output one time sample later. As shown, the output of the cosine time delay element 660 is provided to a second input of the cosine summer 654. The cosine time delay element 660 and the cosine summer 654 in this example operate as a discrete time integrator. This operates to sum values produced by the cosine multiplier for each time sample being processed. After all N samples in the cosine time sequence produced by the cosine generator 620 have been processed by the cosine string 670, a cosine accumulation value acc(cos) 680 is produced as an output of the multiply and accumulate block 604 that corresponds to a correlation value between the measured response waveform and the generated cosine signal.

The other strings of the multiply and accumulate block 604 operate similarly to the cosine string 670 except they correlate the time sequence of samples of the measured response waveform produced by the A-to-D converter 640 with the time sequences of samples produced by each of the other generators in the signal generator 602. The sine string 671 includes a sine multiplier 644 that multiplies the time sequence of samples generated by the sine generator 622 and the time sequence of samples produced by the A-to-D converter 640, and provides its output to a sine summer 655 that operates with the sine time delay element 661 to sum the product of the time samples produced by the sine multiplier 644. After the N samples are processed, a sine accumulation value acc(sin) 681 is produced as an output of the multiply and accumulate block 604 that corresponds to a correlation value between the measured response waveform and the generated sine signal.

The constant term string 672 includes a constant term multiplier 646 that multiplies the time sequence of samples generated by the constant term generator 624 and the time sequence of samples produced by the A-to-D converter 640. The constant term multiplier 646, constant summer 656, and constant time delay element 662 operate in a manner similar to that described above for the cosine string 670 to produce a constant accumulation value acc(poly$_0$) 682. The constant accumulation value acc(poly$_0$) 682 is produced as an output of the multiply and accumulate block 604 that corresponds to a correlation value between the measured response waveform and the generated constant term component.

The linear string 673 includes a linear term multiplier 648, a linear term summer 657, and a linear term time delay element 663 that operate in a manner similar to that described above to produce a linear accumulation value acc(poly$_1$) 683 as an output of the multiply and accumulate block 604 as is described for the other strings to produce a linear accumulation value acc(poly$_1$) 683 that corresponds to a correlation value between the measured response waveform and the generated linear term component.

The quadratic string 674 includes a quadratic term multiplier 650, a quadratic term summer 658, and a quadratic term time delay element 664 that operate in a manner similar to that described above to produce a quadratic accumulation value acc(poly$_2$) 684 as an output of the multiply and accumulate block 604 that corresponds to a correlation value between the measured response waveform and the generated quadratic term component.

The $n^{th}$ order string 675 includes a $n^{th}$ order term multiplier 652, a $n^{th}$ order term summer 659, and a $n^{th}$ order term time delay element 665 that operate in a manner similar to that described above to produce a $n^{th}$ order accumulation value acc(poly$_n$) 685 that corresponds to a correlation value between the measured response waveform and the generated $n^{th}$ order term component.

As described above, the accumulation values produced by the various multiply and accumulate strings correspond to respective correlation values within a set of correlation values. In some examples, the accumulated results produced by the strings of the multiply and accumulate block 604 are assembled into a vector, which is an example of a vector containing a set of correlation values. The values in this vector are then transformed in some examples into the coefficients of a "fit function." The term "fit function" is used to refer to a function that has a number of terms where each term has a respective coefficient that corresponds to a value that is useful in determining the complex impedance of the energy cell 104 and in some examples are values that are useful in determining other parameters or characteristics of the energy cell 104.

The set of correlation values, such as a set containing the above described cosine accumulation value acc(cos) 680, sine accumulation value acc(sin) 681, constant accumulation value acc(poly$_0$) 682, linear accumulation value acc(poly$_1$) 683, quadratic accumulation value acc(poly$_2$) 684, and $n^{th}$ order accumulation value acc(poly$_n$) 685, are provided to a matrix multiply block 606. The matrix multiply block 606 in an example operates to multiply the set of correlation values by a transformation matrix. The transformation matrix in an example untangles the crosstalk between the accumulated results and the matrix multiply block 606. The matrix multiply block 606 in an example produces the coefficients of a fit function, which is referred to herein as a set of fitted coefficients. This set of fitted coefficients in an example is also able to be conceived as a vector that has dimensions corresponding to the dimensions of the vector containing the set of correlations values. The set of fitted coefficients in an example is a set of coefficients that correspond to coefficients, i.e., the amplitudes, of the sine signal, cosine signal, and a polynomial that represents the response signal waveform observed on the energy cell when the stimulus signal is applied.

In an example, the set of fitted coefficients includes a coefficient for a cosine term $M_{real}$ 690, a coefficient for a sine term $M_{imag}$ 692, and one or more respective coefficients for the one or more terms of a power series such as the illustrated coefficient of the constant term $C_0$ 693, the coefficient of the linear term $C_1$ 694, the coefficient of the quadratic term $C_2$ 695, and the coefficient of the $n^{th}$ term $C_n$ 696. In this example, the coefficient for a cosine term $M_{real}$ 690 is an example of a fitted co-sinusoidal coefficient corresponding to a magnitude of a co-sinusoidal signal component within the time sequence of measured values at the characterizing frequency. The coefficient for a sine term $M_{imag}$ 692 is an example of a fitted sinusoidal coefficient corresponding to a magnitude of a sinusoidal signal component within the time sequence of measured values at the characterizing frequency that is ninety degrees out of phase with the co-sinusoidal signal component. The one or more respective coefficients for the one or more terms of a power series such as the illustrated coefficient of the constant term $C_0$ 693, the coefficient of the linear term $C_1$ 694, the coefficient of the quadratic term $C_2$ 695, and the coefficient of the $n^{th}$ term $C_n$ 696 are examples of respective fitted coefficient corresponding to each of the at least one time sequence corresponding to a respective term of a power series polynomial.

The transformation matrix by which the vector of correlations values is multiplied in an example is a square, symmetrical, sparse matrix whose elements can be computed in a straightforward manner and whose elements depend only on the total number of samples (N) and the integer number of sine/cosine wave cycles (k) within those total number of samples (N) used to determine the vector of accumulated values. The dimension of this square symmetric matrix is defined by the number of terms generated within the signal generator 602. Due to the sparsity of this transformation matrix, it can be efficiently stored with a relatively small memory footprint. Determination of an example transformation matrix is described below.

In an example, a "fit function" is able to have four terms that have coefficients as are described above. An example of such a fit function is:

$$f_{fit}(n) = c_0 \cdot 1 + M_{real} \cdot \cos\left(\frac{2\pi k n}{N}\right) + M_{imag} \cdot \sin\left(\frac{2\pi k n}{N}\right) + c_1 \cdot \left(\frac{2n}{N} - 1\right)$$

Where:
n is the present sample number,
k is the number of cycles of the sinusoid being applied over N samples,
N is the total number of samples to be processed,
$M_{real}$ is the coefficient for, or the magnitude of, the real component of the energy cell's impedance,
$M_{imag}$ is the coefficient for, or the magnitude of, the imaginary component of the energy cell's impedance,
$c_0$ is the coefficient of the constant term, which indicates an average value measured over the N samples of the measurement interval, of the polynomial that is a power series representing the curve superimposed on the sinusoidal stimulus waveform, and
$c_1$ is the coefficient, or magnitude, of the linear term of the polynomial that is a power series representing the curve superimposed on the sinusoidal stimulus waveform.

In the above fit function, the four terms correspond to a cosine term, a sine term, a constant term, and a linear term. The average of these terms, except for the $C_0$ term, is zero, thus allowing these terms to form a sparse matrix. Solving for the coefficients of this fit function provides the magnitudes of the cosine and sine components of the measured response signal along with coefficients of the terms of a polynomial that is a power series that represents the waveform that is superimposed on the sinusoidal response waveform. In this example, the magnitude of the constant coefficient is the DC component of the measured response waveform, and the coefficient of the linear term is the magnitude of the slope of the waveform that is superimposed on the sinusoidal components of the response waveform. As is to be understood in light of this description, the systems and methods described herein are able to be adapted to determine coefficients of terms of a polynomial that is a power series of any order.

In the above example of a fit function with four terms, the coefficients of those four terms are four unknowns represented as what is referred to herein as a characterization vector: ($c_0$, $M_{real}$, $M_{imag}$, $c_1$). As described above with regards to impedance measurement system block diagram 600, the signal generator 602 includes generators that each generates time sequences of samples of various waveforms that are to be correlated with the measured response. In this example, the signal generator will produce the following sequences of samples, where each sample has a sequence number "n" where (0≤n<N).

Constant term generator 624 produces a constant value of 1;

Cosine generator 620 produces $\cos\left(\frac{2\pi k n}{N}\right)$

Sine generator 622 produce = $\sin\left(\frac{2\pi k n}{N}\right)$

Linear term generator 626 produces = $\frac{2n}{N} - 1$

These sequences are, respectively, a constant of 1, a cosine and a sine sequence of k cycles with an amplitude of 1 over the N samples, and a linear slope term that increases from
−1 to 1 over the N samples.

Figure 6A:
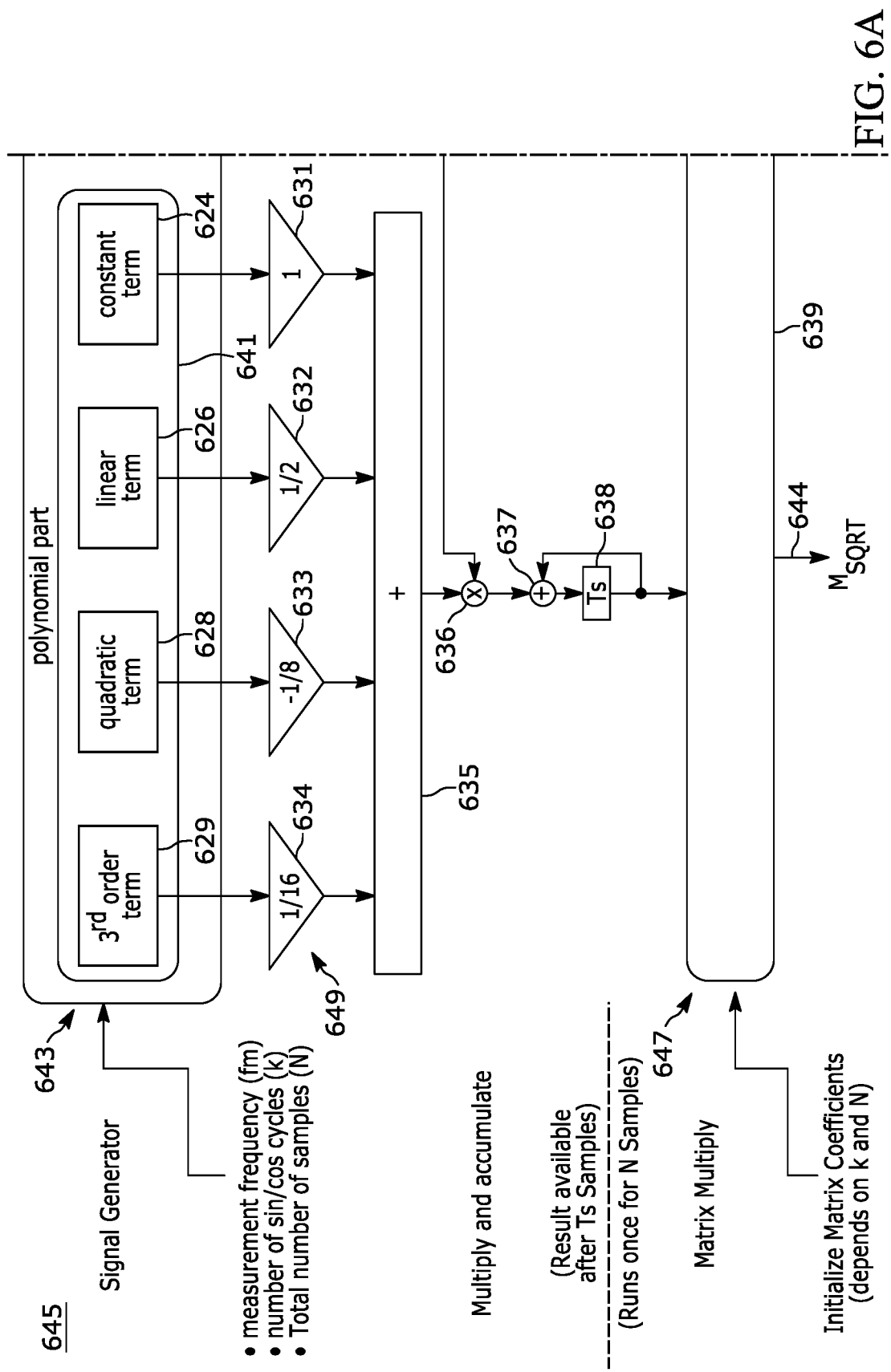
FIG. 6A illustrates an alternative power series polynomial measurement system, according to an example.

FIG. 6A illustrates an alternative power series polynomial measurement system 645, according to an example. The alternative power series polynomial measurement system 645 performs alternative processing to determine correlation coefficients between terms of the above described power series based upon a Taylor expansion of the power series polynomial.

A Taylor expansion of a function, which is sometimes referred to as a Taylor series, is understood by practitioners of ordinary skill in the relevant arts and expresses a value of a function at a point as a sum of derivatives of that function. The value of a function at a particular point is able to be approximated by evaluating a finite number of derivatives of that function. An approximation of function $f$ at point x using M Taylor series terms is as follows:

$$f(x) = \Sigma_{n=0}^{M} \frac{f^{(n)}(x)}{n!}(x)^n$$

As an example, using a fit function of $y=\sqrt{1+x}$, the first four terms of a Taylor expansion are:

$$f(x) = 1 + \frac{1}{2}x - \frac{1}{8}x^2 + 1/16 x^3$$

The alternative power series polynomial measurement system 645 includes a signal generator 643 with a polynomial part 641 that generates time sequences corresponding to the polynomial terms of the above described fit function. The polynomial part 641 is an example of a signal generator that generates a time sequence corresponding to a respective term of a power series corresponds to a time sequence of a fit function represented by a Taylor series having N terms, In the illustrated example, the alternative power series polynomial measurement system 645 multiplies the values in each time sequences generated by the polynomial part by a respective constant multiplier in a Taylor series coefficient multiplier 649. In the illustrated example, the output of the constant term 624 is multiplied by one 631, which represents that the constant value is simply passed on without processing. The output of the linear term 626 is multiplied by one half ($\frac{1}{2}$) by a one half multiplier 632, which corresponds to the value of the coefficient of the linear term of the Taylor series expansion presented above. The output of the quadratic term 628 is multiplied by negative one eighth ($-\frac{1}{8}$) by a negative one eighth multiplier 633, which corresponds to the value of the coefficient of quadratic term of the Taylor series expansion presented above. The output of the third order term 629 is multiplied by one sixteenth ($\frac{1}{16}$) by a one sixteenth multiplier 634, which corresponds to the value of the coefficient of the third order term of the Taylor series expansion presented above.

At each sample, these multiplied Taylor series terms are summed by a Taylor series summer 635 and provided to a Taylor series multiplier 636. The Taylor series multiplier 636 multiplies for each time sample the time sequence of Tayler series summations of produced by the Taylor series summer 637 and the time sequence of samples generated by the A-to-D converter 640. This product is then accumulated by the Taylor series summer 637 and the Taylor series time delay 638 over the N measurement samples as discussed above. This value corresponds to a correlation value between the measured response waveform and the generated fit function. This combination of multiplying and accumulating is an example of determining a set of correlation values by determining a correlation value between the time sequence of measured values and a time sequence of sums of terms of the time sequence of the Taylor series.

In the above-described Taylor series example, the Taylor series of a candidate fit function (sqrt(1+x)) defines the ratios between the polynomial coefficients of the signal generator. These signal generator terms are added together and fed to a multiply-add stage. In this example, the matrix multiply block 647 multiplies the accumulated values for the sine, cosine and Taylor series, referred to in the drawings as sqrt(1+x) by a matrix B that is square and symmetric with three rows/columns and produces the magnitudes of correlation between the monitored response signal and the sine, cosine and sqrt(1+x) signals. This matrix multiplication is an example of the set of fitted coefficients further comprises a respective fitted coefficient corresponding to each of the at least one time sequence corresponding to the time sequence of the fit function represented by a Taylor series.

FIG. 7 illustrates an example of a 4×4 $B=(M^TM)^{-1}$ matrix equation for a characterization polynomial up to first order 700, according to an example. The 4×4 $(B=M^TM)^{-1}$ matrix equation for a characterization polynomial up to first order 700 shows a matrix multiplication equation by which the above described characterization vector is determined. The 4×4 $B=(M^TM)^{-1}$ matrix equation for a characterization polynomial up to first order 700 shows the accumulation value vector 708, which has elements produced by the multiply and accumulate block 606 discussed above, over the N samples that are to be processed for a particular frequency at which the complex impedance is to be measured. The accumulation value vector 708 in this example is multiplied by a transformation matrix 704 and a scaling factor 706 to obtain the characterization vector 702, which contains the fitted coefficients of the signal generator. Methods to determine values of elements in a transformation matrix 704 are described below.

In the above described example, the matrix multiply block 606 performs this multiplication and produces the characterization vector 702, i.e., ($c_0$, $M_{real}$, $M_{imag}$, $c_1$). An example of deriving the values of the elements of this matrix is described below.

The top row 710 of the transformation matrix 704 corresponds to values by which the accumulation value vector 708 are multiplied and summed to determine the $c_0$ element of the characterization vector 702. The $C_0$ element represents the average value of the response voltage signal during the measurement. In an example of the impedance measurement system block diagram 600, the constant term string 672 operates to add the voltages measured for the response waveform, i.e., the constant term multiplier 646 multiplies by a value of one. This operation is able to be realized without a multiplier and just using the measured value directly. After gathering N samples, the accumulated result appears at the $poly_0$ accumulator output 682 as the sum of the voltage samples. The matrix multiplication part for the $c_0$ term therefore only involves the $poly_0$ term and the number of samples:

$$c_0 = \frac{poly_0}{N} = \frac{1}{N} \cdot \Sigma_{n=0}^{N-1} V_n$$

This corresponds to the top row of the transformation matrix having the values [1, 0, 0, 0] as is shown.

Derivation of the other polynomial coefficients is described below.

An example of a derivation of the other rows of the transformation matrix via linear algebra techniques follows. With a matrix representation of fitting a function for the full measured time sequence of N samples, the characterization vector 702 can be expressed by the following matrix equation.

$$M \cdot \vec{x} = \vec{y} \leftarrow f_{fit}(n) = c_0 \cdot f_0(n) + c_1 \cdot f_1(n) + \ldots + c_{z-1} \cdot f_{z-1}(n)$$

The columns of matrix M in the above equation define the fit function terms $f_0 \ldots f_{z-1}$ where each row contains the individual sample n for each function term. The vector $\vec{x}$ holds the scalar coefficients $c_0 \ldots c_{z-1}$ of each term and the output vector $\vec{y}$ contains the linear combination of all terms $f_{fit}(n)$. The row dimension of matrix M and vector $\vec{y}$ is equal to the total number of samples N. The number of matrix M columns and vector $\vec{x}$ rows is equal to the amount of fit function terms z.

In an example, a linear least squares method uses a computational approach to fit a mathematical model $f_{fit}(n)$ with the measurement data $\vec{y}$. Mathematically, the linear least squares method solves an overdetermined system of linear equations, where the best approximation is defined as the one that minimizes the sum of the square differences between the measurement data and their corresponding modeled values. The best approximation for the scalar coefficients $\vec{\tilde{x}}$ of the fit function can be calculated as such:

$$M \cdot \vec{x} = \vec{y} \rightarrow (M^T \cdot M) \cdot \vec{\tilde{x}} = M^T \cdot \vec{y} \rightarrow \vec{\tilde{x}} = (M^T \cdot M)^{-1} \cdot M^T \cdot \vec{y}$$

The generator matrix M in the above equations contains the samples of the fit function, as generated by the signal generator 602, for all terms and does not depend on the measured data set. Hence, for a known fit function, the matrix A can be calculated directly to transform the measurement data into the approximated scalar coefficient vector.

$$\vec{\tilde{x}} = A \cdot \vec{y} \text{ where } A = (M^T \cdot M)^{-1} \cdot M^T$$

An alternative example is able to directly calculate matrix A from the above equation. This approach may use a large storage area to hold the coefficients of matrix A with large data sets. Note that the column dimension of matrix A depends on the number of measurement data samples N and the row dimension depends on the amount of fit function terms. As an example, measuring the impedance of a plant-microbial fuel cell at 10 μHz, applying 10 sinusoidal cycles at a sample rate of 1 sample/second with 4 floating point terms could use 16 Megabytes of storage capacity:

$$10 \mu Hz \rightarrow 10^5 \text{ seconds} \cdot 10 \text{ cycles} =$$

$$10^6 \text{ sec} \cdot 1 \frac{\text{sample}}{\text{sec}} \cdot 4 \text{ coef} \cdot 4 \frac{\text{bytes}}{\text{coef}} = 16 \text{ Mbyte}$$

In some examples, such as embedded solutions, minimizing chip area has many benefits. Examples described below generate the matrix coefficients on-the-fly, thereby reducing its required storage area. In order to achieve this, the calculation of the scalar coefficients is split up into two parts:

$$\vec{\tilde{x}} = (M^T \cdot M)^{-1} \cdot M^T \cdot \vec{y} \rightarrow \vec{\tilde{x}} = B \cdot \vec{acc} \text{ and } \vec{acc} = M^T \cdot \vec{y}$$

where $B = (M^T \cdot M)^{-1}$

The inverse of the symmetric and square matrix produced by the product $(M^T \cdot M)$ is also by definition a symmetric square matrix, which is identified above as matrix B. The dimension of matrix B depends only on the number of scalar coefficients. The values of the coefficients depend on the number of samples N and sine/cosine wave cycles, defined by k. In comparison to the previous example, the storage capacity for B now reduces to 64 bytes. Since the averages of all terms of the polynomial representing the measured waveform, except for the constant, DC term, are set up to be zero, the matrix B is sparse and in this example contains 6 non-zero coefficients out of a total of 16 in the 4×4 matrix. By storing only these 6 non-zero coefficients, matrix B can be stored in 24 bytes:

$$(4 \text{ coef})^2 \cdot 4 \frac{\text{bytes}}{\text{coef}} = 64 \text{ bytes} \xrightarrow{\text{sparse}} \frac{6}{16} \cdot 64 = 24 \text{ bytes}$$

The second part of the calculation involves the transposed generator matrix $M^T$ and the acquired measurement samples $\vec{y}$. Here the rows of $M^T$ correspond with the signal generator terms (1 ... m) and the columns represent the values of the terms (1 ... n) and are generated on-the-fly. For every calculation step (0≤s<N), the actual column is generated, multiplied with the associated voltage sample and added to the previous result of the accumulator. The calculation of $M^T \cdot \vec{y}$ can be decomposed as:

$$M_{m \cdot n}^T \cdot \vec{y}_{n \cdot 1} \rightarrow \begin{bmatrix} c_{1,1} \\ \vdots \\ c_{m,1} \end{bmatrix}_{s=0} \cdot y_1 + \begin{bmatrix} c_{1,2} \\ \vdots \\ c_{m,2} \end{bmatrix}_{s=1} \cdot y_2 + \ldots + \begin{bmatrix} c_{1,n} \\ \vdots \\ c_{m,n} \end{bmatrix}_{s=n-1} \cdot y_n$$

After acquiring samples, the vector $\vec{acc}$ is multiplied with matrix B to obtain the least squares best fit scaler coefficients $\vec{\tilde{x}}$. Note that this transformation is required only once per measured frequency.

Calculating the Transformation Matrix B

The signal generator consists of two parts: a sine/cosine and power series polynomial generator. The average of all terms is zero over a range of N samples, except for the constant term. The constant, cosine, sine, odd and even power series polynomial terms are defined over a range 0≤n<N. Furthermore, k specifies an integer number of sine and cosine wave cycles over N samples and p defines the order of the power series polynomial term:

constant: 1

$$\text{cosine: } \cos \frac{2\pi k n}{N}$$

$$\text{sine: } \sin \frac{2\pi k n}{N}$$

power series polynomial "p" (p is odd): $\left(\frac{2n}{N} - 1\right)^p p = 1, 3, 5,$ power series polynomial "p" (p is even): $\left(\frac{2n}{N} - 1\right)^p - \frac{1}{p+1} p = 2, 4, 6,$ These terms define the generator matrix M and are also used to calculate $M^T M$ which represents the inverse of the desired matrix B.

Figure 8:
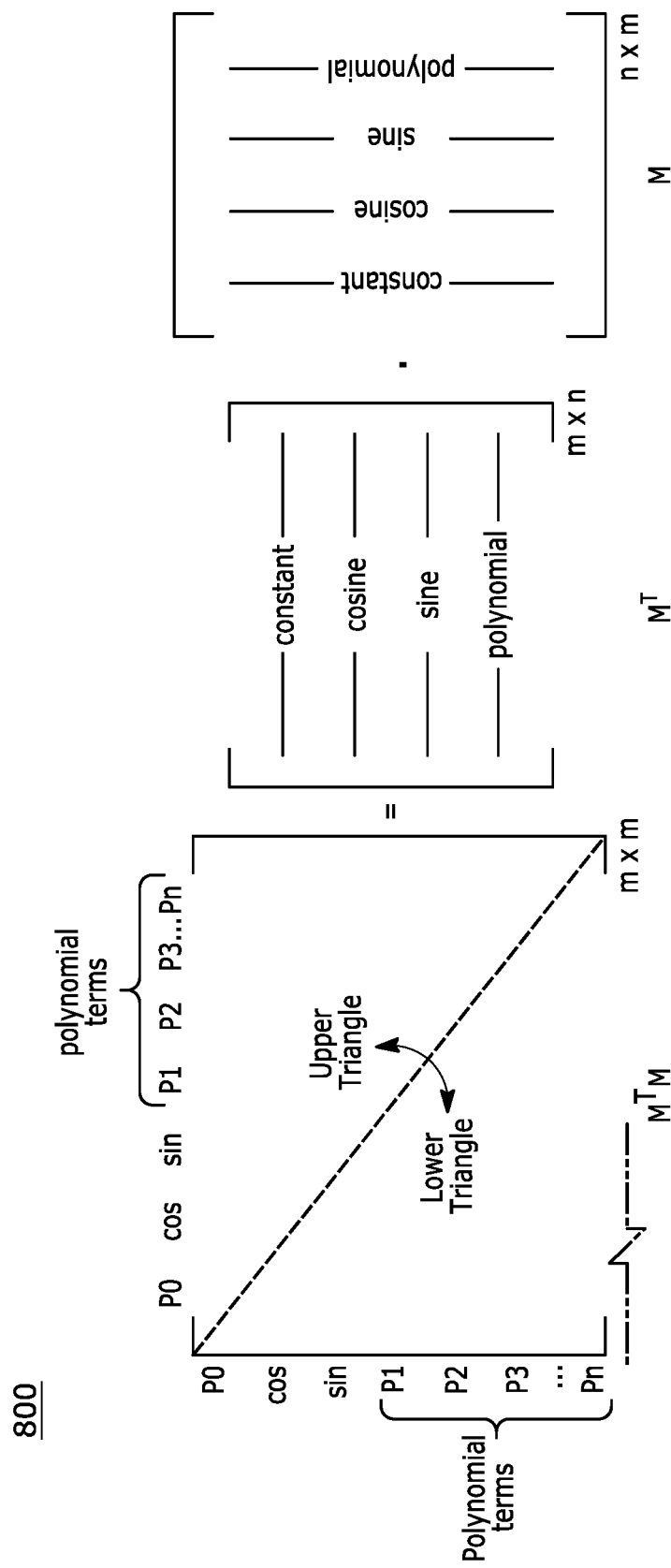
FIG. 8 depicts a graphical presentation of the $M^TM$ coefficients calculation, according to an example.

FIG. 8 depicts a graphical presentation of the $M^T M$ coefficients calculation 800, according to an example. Since this matrix is symmetric, the lower triangle mirrors the upper, thereby reducing the calculations to roughly half of the coefficients. For each $M^T M$ coefficient, the dot product between the associated $M^T$ row vector and M column vector is calculated. The first step involves the calculation of diagonal coefficients, otherwise known as the trace of $M^T M$.

The dot product of the constant terms:

$$dc^2 = \Sigma_{n=0}^{N-1} 1^2 = N$$

The dot product of the cosine terms:

$$\cos^2 = \sum_{n=0}^{N-1} \cos^2\left(\frac{2\pi k n}{N}\right) = \frac{N}{2}$$

The dot product of the sine terms:

$$\sin^2 = \sum_{n=0}^{N-1} \sin^2\left(\frac{2\pi kn}{N}\right) = \frac{N}{2}$$

The dot product of the power series odd polynomial terms:

$$pol_{odd}^2 = \sum_{n=0}^{N-1}\left(\frac{2n}{N} - 1\right)^{2p} = \frac{N}{2p+1} \quad p = 1, 3, 5, \cdots$$

The dot products of the power series even polynomial terms:

$$pol_{even}^2 = \sum_{n=0}^{N-1}\left(\left(\frac{2n}{N} - 1\right)^p - \frac{1}{p+1}\right)^2 = N \cdot \left(\frac{1}{2p+1} - \frac{1}{(p+1)^2}\right) \quad p = 2, 4, 6, \cdots$$

The second step calculates the dot product between the cosine and the power series polynomial terms with even powers. For odd powers, the dot product is zero.

$$\cos \cdot pol_{even} = \sum_{n=0}^{N-1}\left(\left(\frac{2n}{N} - 1\right)^p - \frac{1}{p+1}\right) \cdot \cos\frac{2\pi kn}{N} =$$

$$N \cdot \frac{p}{(k\pi)^p} \cdot \left((k\pi)^{p-2} - \frac{(p-1)!}{(p-3)!} \cdot (k\pi)^{p-4} + \frac{(p-1)!}{(p-5)!} \cdot (k\pi)^{p-6} - \cdots\right)$$

The length of the series depends on the value of p and can also be written as:

$$\cos \cdot pol_{even} = N \cdot \left\{\frac{p}{(k\pi)^2} - \frac{p!}{(p-3)!} \cdot \frac{1}{(k\pi)^4} + \frac{p!}{(p-5)!} \cdot \frac{1}{(k\pi)^6} - \cdots\right\}$$

$$\cos \cdot pol_{even} = N \cdot \sum_{i=0}^{\frac{p-2}{2}} (-1)^i \cdot \frac{p!}{(p-2i-1)!} \cdot \frac{1}{(k\pi)^{2i+2}}$$

The following example lists the values for the first three terms with power series even polynomial powers:

$$p = 2 \rightarrow N \cdot \frac{2}{(k\pi)^2}$$

$$p = 4 \rightarrow N \cdot \left(\frac{4}{(k\pi)^2} - \frac{24}{(k\pi)^4}\right)$$

$$p = 6 \rightarrow N \cdot \left(\frac{6}{(k\pi)^2} - \frac{120}{(k\pi)^4} + \frac{720}{(k\pi)^6}\right)$$

The third step calculates the dot product between the sine and the power series polynomial terms with odd powers. In this case, the dot product for even powers is zero.

$$\sin \cdot pol_{odd} = \sum_{n=0}^{N-1}\left(\frac{2n}{N} - 1\right)^p \cdot \sin\frac{2\pi kn}{N} =$$

$$-N \cdot \frac{1}{(k\pi)^p} \cdot \left((k\pi)^{p-1} - \frac{p!}{(p-2)!} \cdot (k\pi)^{p-3} + \frac{p!}{(p-4)!} \cdot (k\pi)^{p-5} - \cdots\right)$$

The length of the series depends on the value of p and can also be written as:

$$\sin \cdot pol_{odd} = -N \cdot \left\{\frac{1}{k\pi} - \frac{p!}{(p-2)!} \cdot \frac{1}{(k\pi)^3} + \frac{p!}{(p-4)!} \cdot \frac{1}{(k\pi)^5} - \cdots\right\}$$

$$\sin \cdot pol_{odd} = -N \cdot \sum_{i=0}^{\frac{p-1}{2}} (-1)^i \cdot \frac{p!}{(p-2i)!} \cdot \frac{1}{(k\pi)^{2i+1}}$$

The following examples lists the values that are found for the first three terms with power series odd polynomial powers:

$$p = 1 \rightarrow -N \cdot \frac{1}{k\pi}$$

$$p = 3 \rightarrow -N \cdot \left(\frac{1}{k\pi} - \frac{6}{(k\pi)^3}\right)$$

$$p = 5 \rightarrow -N \cdot \left(\frac{1}{k\pi} - \frac{20}{(k\pi)^3} + \frac{120}{(k\pi)^5}\right)$$

The fourth step calculates the dot product between the power series polynomial terms when both powers are odd or even. If one of the powers is even and the other is odd or vice-versa, the dot product is zero.

$$pol_{odd} \cdot pol_{odd} = \sum_{n=0}^{N-1}\left(\frac{2n}{N} - 1\right)^p \cdot \left(\frac{2n}{N} - 1\right)^q = \frac{N}{p+q+1}$$

$$pol_{even} \cdot pol_{even} = \sum_{n=0}^{N-1}\left(\left(\frac{2n}{N} - 1\right)^p - \frac{1}{p+1}\right) \cdot \left(\left(\frac{2n}{N} - 1\right)^q - \frac{1}{q+1}\right)$$

$$= N \cdot \left(\frac{1}{p+q+1} - \frac{1}{(p+1) \cdot (q+1)}\right)$$

Terms not defined above are zero.

Figure 9:
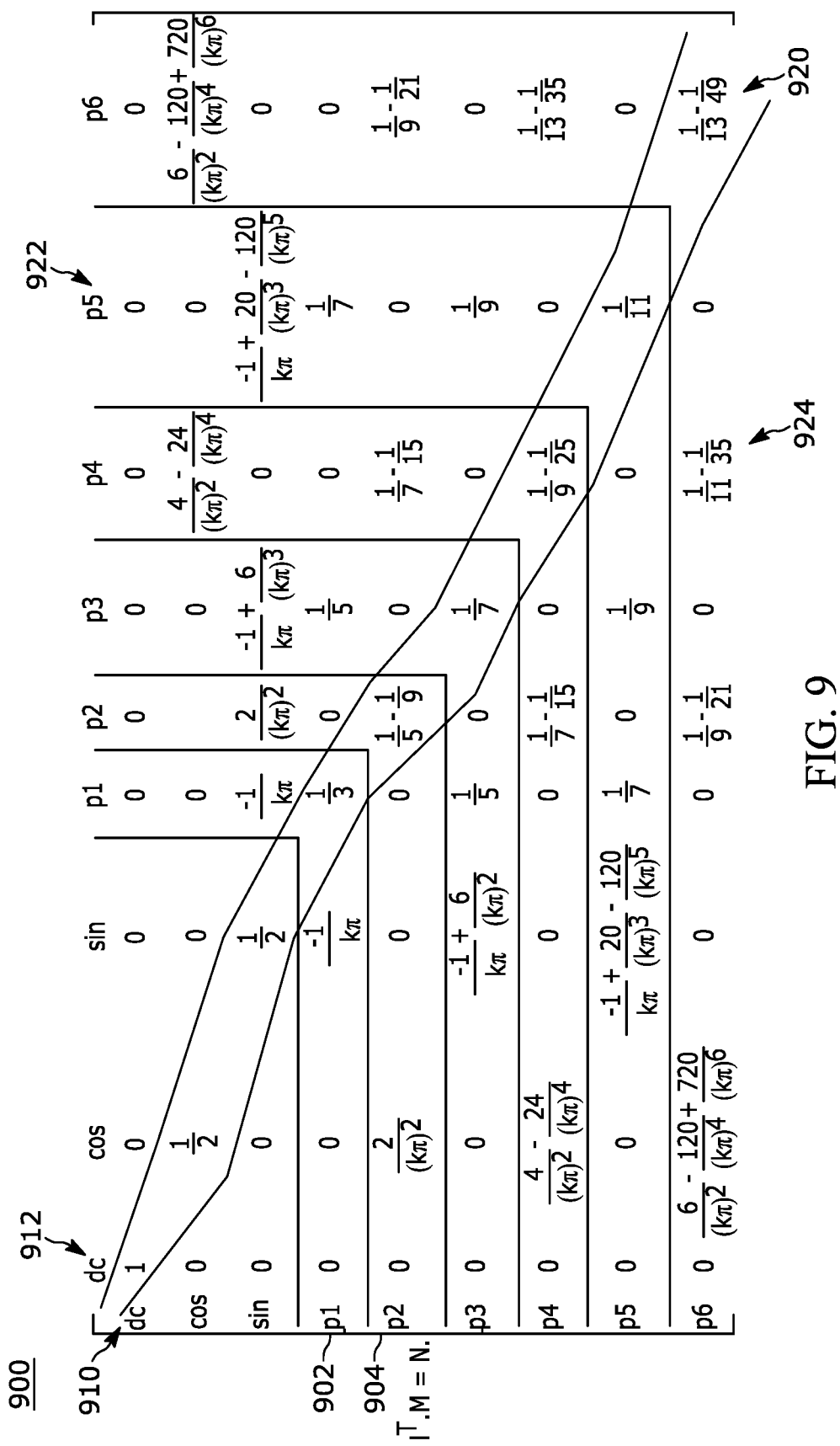
FIG. 9 illustrates an example transformation matrix $(M^TM)$ for a polynomial up to six coefficients, according to an example.

FIG. 9 illustrates an example transformation matrix ($M^TM$) for a polynomial up to sixth order 900, according to an example. The example transformation matrix ($M^TM$) for a polynomial up to sixth order 900 depicts calculated coefficients of the power series polynomial up to the sixth order The example transformation matrix ($M^TM$) for a polynomial up to sixth order 900 is used to calculate a transformation matrix, described as B=$(M^TM)^{-1}$, which is the inverse of the matrix product $M^TM$ as is described above.

The example transformation matrix ($M^TM$) for a polynomial up to sixth order 900 depicts values of determined sine coefficient, cosine coefficient, and coefficients of the power series polynomial power series up to the sixth order. Similar transformation matrices are able to be determined with coefficients that correspond to power series polynomial power series of any order based on the above defined equations.

The example transformation matrix ($M^TM$) for a polynomial up to sixth order 900 depicts a row index 910 and a column index 912 that shows the sine, cosine, and power series polynomial term descriptors for the elements in those rows and columns to better illustrate the associated dot product coefficients in the matrix. The row index 910 and column index 912 are not part of the transformation matrix and those values are only shown to better illustrate the contents of this matrix.

Various sub-parts of the example transformation matrix ($M^TM$) for a polynomial up to sixth order 900 are shown. The example transformation matrix ($M^TM$) for a polynomial up to sixth order 900 includes a "trace" containing the diagonal coefficients 920, an upper triangle 922, and a lower triangle 924. As shown, the example transformation matrix ($M^TM$) for a polynomial up to sixth order 900, the diagonal coefficients 920 and coefficients in the upper triangle 922 have values that correspond to the equations described above. The example transformation matrix ($M^T M$) for a polynomial up to sixth order 900 is symmetrical, as shown by the values of the coefficients in the lower triangle 924 corresponding to values of the upper triangle 922.

The rectangular boxes indicate the relevant part of the matrix for a power series polynomial up to a certain power (p1 ... p6). For example, the portion including the linear part 902 includes elements of a transformation matrix to process power series polynomials up to order one. The portion including the quadratic part 904 includes elements of a transformation matrix to process power series polynomials up to order two. The additional rows and columns are able to be used to process power series with higher order polynomials. Once the matrix $M^T M$ is determined, the desired matrix B can be calculated as $B = (M^T \cdot M)^{-1}$, which is the inverse of $M^T M$. The matrix B can be found numerically with established techniques such as Gaussian elimination.

FIGS. 10-13 depict a sequence of transformation matrix simplification operations to calculate the values of elements of the transformation matrix B discussed above. Because matrix $M^T \cdot M$ is symmetric it can first be decomposed into a lower and upper triangle $L \cdot L^T$ by applying Cholesky factorization. In the illustrated example, Cholesky factorization is shown for a power series polynomial with up to second order terms→p2).

FIG. 10 illustrates an $M^T \cdot M$ Cholesky decomposition performed for up to a second order polynomial 1000, according to an example. The $M^T \cdot M$ decomposition 1000 depicts the $M^T \cdot M$ decomposed into a lower and upper triangle $L \cdot L^T$ by applying Cholesky decomposition.

The rectangular box formed by the partition within each matrix indicates the sub-matrix when only the linear term of the power series polynomial is considered. The matrix in this example is limited to the quadratic power series polynomial term to demonstrate the calculation process.

FIG. 11 illustrates an upper triangle matrix calculation 1100, according to an example. The upper triangle matrix calculation 1100 depicts calculation of the inverse of the upper triangle matrix $L^T$ as U 1110, where $U \rightarrow (L^T)^{-1}$, which results in the reconstruction of matrix B as $1/N \cdot U \cdot U^T$ where $U^T$ is depicted as $U^T$ 1120. The partitions 1130, 1132 in these matrixes indicate the sub-matrix for the linear term.

FIG. 12 illustrates a Matrix $B = (M^T M)^{-1}$ matrix equation for a polynomial up to first order 1200 as is shown in FIG. 7, according to an example. The matrix $B = (M^T M)^{-1}$ matrix equation for a polynomial up to first order 1200 as is shown in FIG. 7, depicts calculating a 4×4 Matrix $B = (M^T M)^{-1}$ 1210, which corresponds to the above described transformation matrix 704, by multiplying the sub-matrices of the linear term.

Specifying matrix B in the decomposed form $1/N \cdot U \cdot U^T$ has an advantage that the coefficients of U and $U^T$ do not depend on the power series polynomial order and can directly be taken from the associated sub-matrix box to calculate the matrix B.

FIG. 13 illustrates a $B = (M^T M)^{-1}$ matrix equation result for a polynomial up to second order 1300, according to an example. The matrix $B = (M^T M)^{-1}$ matrix equation result for a polynomial up to second order 1300 reflects the structure of a transformation matrix when the linear and quadratic terms of the power series polynomial are taken into account, which yields a 5×5 matrix. This illustrates how the resulting coefficients change in comparison with the 4×4 matrix 1210 discussed above.

Figure 14:
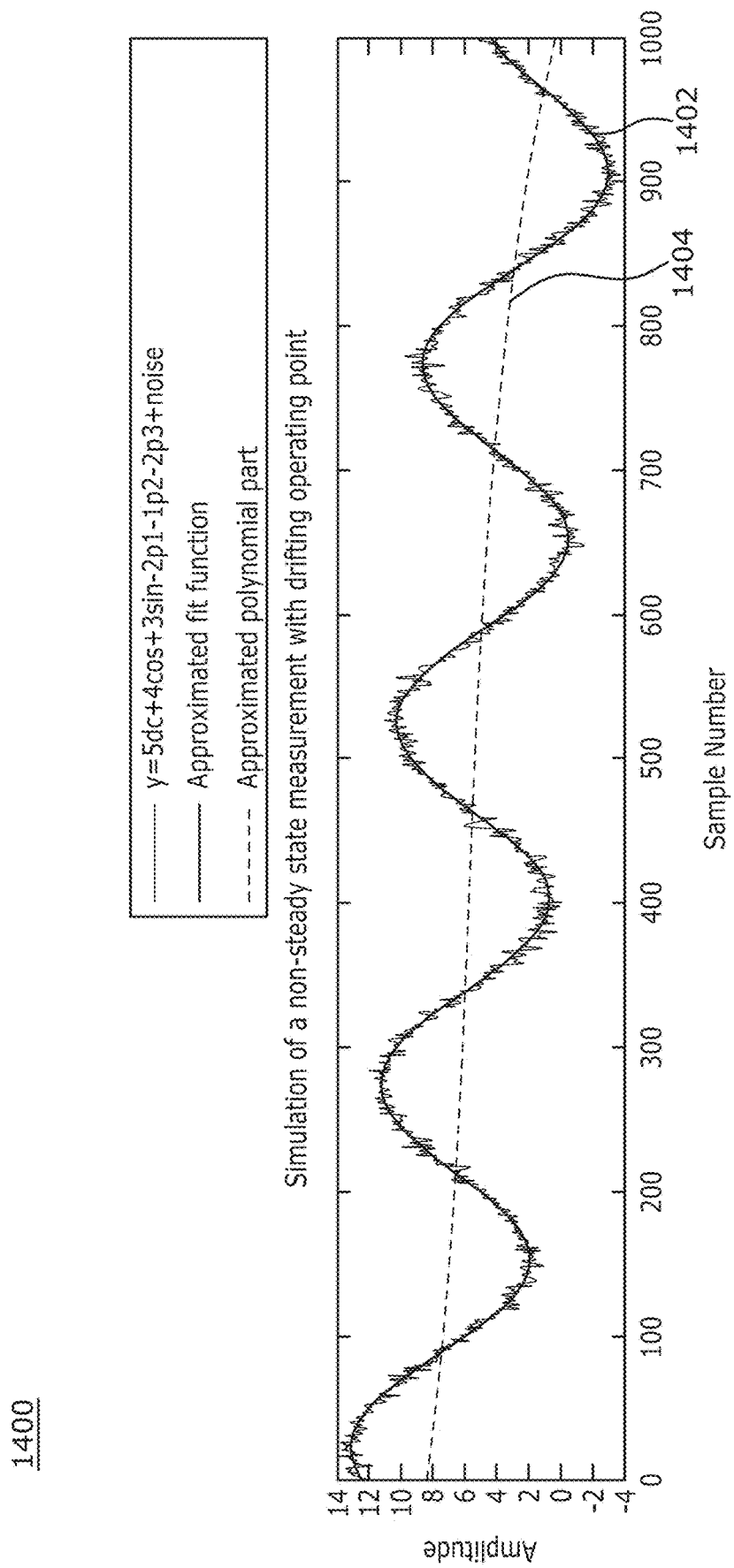
FIG. 14 illustrates the results of a non-steady state measurement simulation, according to an example.

FIG. 14 illustrates the results of a non-steady state measurement simulation 1400, according to an example. The results of a non-steady state measurement simulation 1400 depicts simulation results with a solid line indicating the reconstructed response waveform 1402 for four (4) sine/cosine cycles of a sinusoidal stimulation signal and a dotted line representing the drifting operating point 1404. A changing operating point is simulated to represent a drifting bias current, as can be observed in a P-MFC over a long measurement period, such as with a sinusoidal stimulus signal of 1 µHz, which would last for 12 days.

Figure 15:
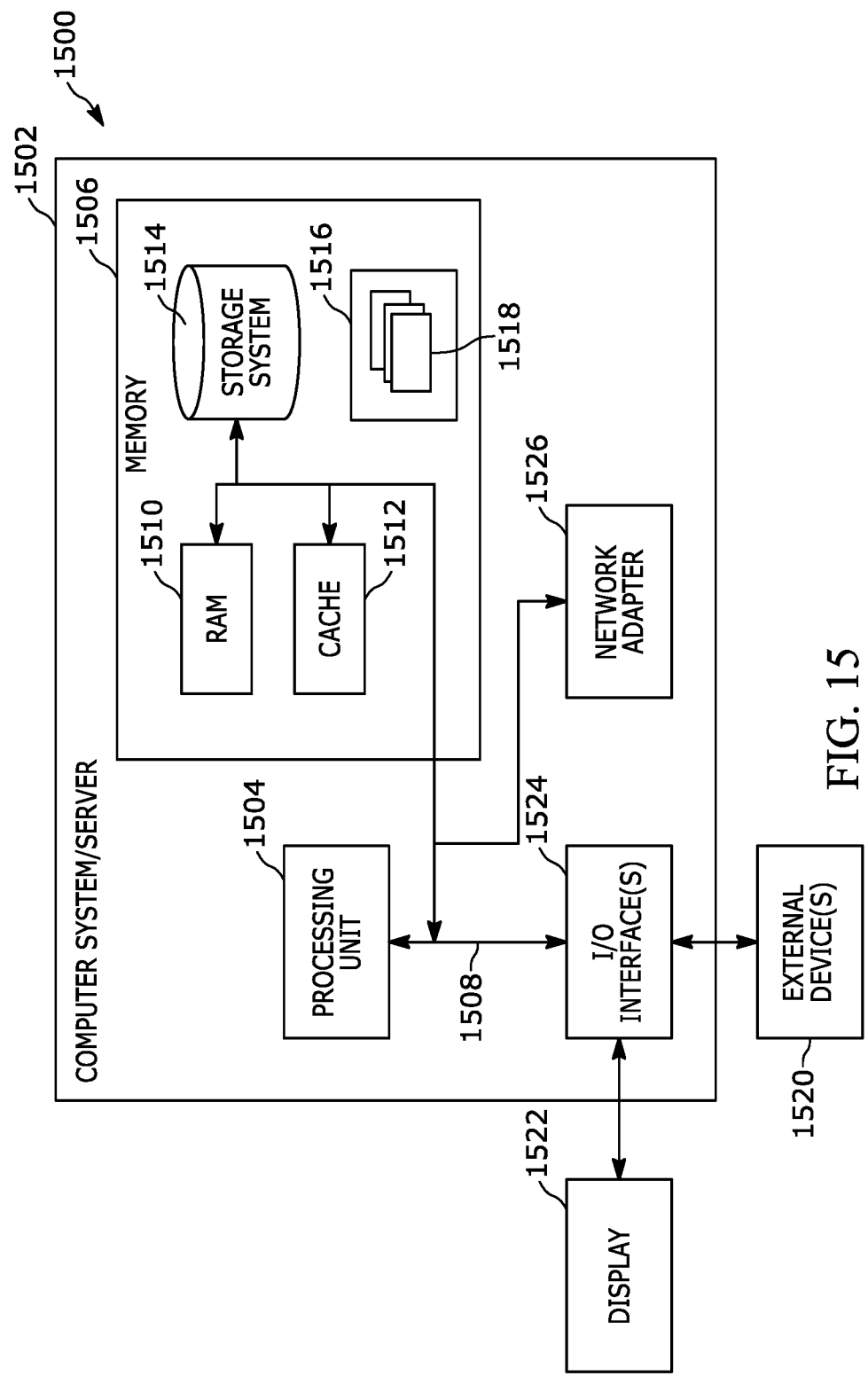
FIG. 15 is a diagram illustrating one example of an information processing system according to one embodiment of the present invention.

FIG. 15 is a block diagram illustrating an information processing system 1500 that can be utilized by one or more examples discussed herein. The computer system/server 1502 is based upon a suitably configured processing system configured to implement one or more examples of the present invention, such as elements of the above described simplified energy cell complex impedance measurement apparatus block diagram 100 or impedance measurement system block diagram 600. Any suitably configured processing system, including specialized processing systems, can be used as the computer system/server 1502. Alternatively to the described information processing system 1500, further examples are able to be implemented in relatively small, limited purpose processors to implement the above described processing. In an example, such processors are able to be integrated with or nearby battery cell packs that are deployed in various applications. Examples of these processors are able to include any combination of general purpose processing hardware, dedicated processing hardware such as dedicated multiply and accumulate circuits, other elements, or combinations of these.

The components of the computer system/server 1502 can include but are not limited to, one or more processors or processing units 1504, a system memory 1506, and a bus 1508 that couples various system components including the system memory 1506 to the processor 1504. The bus 1508 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The system memory 1506 can include computer system readable media in the form of volatile memory, such as random access memory (RAM) 1510 and/or cache memory 1512. The computer system/server 1502 can further include other removable/non-removable, volatile/non-volatile computer system storage media. By way of example only, a storage system 1514 can be provided for reading from and writing to a non-removable or removable, non-volatile media such as one or more solid-state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1508 by one or more data media interfaces. The memory 1506 can include at least one program product having a set of program modules that are configured to carry out the functions of an example of the present disclosure.

Program/utility 1516, having a set of program modules 1518, may be stored in memory 1506 by way of example, and not limitation, as well as an operating system, one or more application programs, other program modules, and program data. Each of the operating system, one or more application programs, other program modules, and program data or some combination thereof, may include an implementation of a networking environment. Program modules 1518 generally carry out the functions and/or methodologies of examples of the present disclosure.

The computer system/server 1502 can also communicate with one or more external devices 1520 such as a keyboard, a pointing device, a display 1522, etc.; one or more devices that enable a user to interact with the computer system/server 1502; and/or any devices, e.g., network card, modem, etc., that enable computer system/server 1502 to communicate with one or more other computing devices. Such communication can occur via I/O interfaces 1524. Still yet, the computer system/server 1502 can communicate with one or more networks such as a local area network (LAN), a general wide area network (WAN), and/or a public network, e.g., the Internet, via network adapter 1526. As depicted, the network adapter 1526 communicates with the other components of the computer system/server 1502 via the bus 1508. Other hardware and/or software components can also be used in conjunction with the information processing system 1500.

The term "coupled", as used herein, is defined as "connected" and encompasses the coupling of devices that may be physically, electrically or communicatively connected, although the coupling may not necessarily be directly and not necessarily be mechanical. The term "configured to" describes hardware, software, or a combination of hardware and software that is adapted to, set up, arranged, built, composed, constructed, designed, or that has any combination of these characteristics to carry out a given function. The term "adapted to" describes hardware, software, or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled.

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit" or "system".

The invention may be a system, a method, and/or a computer program product. The computer program product may include a computer-readable storage medium (or media) having computer readable program instructions thereon for causing a processor to carry out aspects of the invention.

In one embodiment, the computer program product includes a non-transitory storage medium readable by a processing circuit and storing instructions for execution by the processing circuit for performing a method. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media, e.g., light pulses passing through a fiber-optic cable), or electrical signals transmitted through a wire.

Computer-readable program instructions for carrying out operations of the invention may be assembler instructions, instruction-set-architecture (ISA) instructions, machine instructions, machine-dependent instructions, microcode, firmware instructions, state-setting data, or either source code or object code written in any combination of one or more programming languages, including an object-oriented programming language such as Smalltalk, C++, and conventional procedural programming languages, such as the "C" programming language or similar programming languages. The computer-readable program instructions may execute entirely or partly on a user's computer or entirely or partly on a remote computer or server. In the latter scenario, the remote computer may be connected to the user's computer through any type of network, including a local area network (LAN), a wide area network (WAN), an Ultra-Wide Band (UWB) network, or the connection may be made to an external computer (for example, through the Internet). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the invention.

Aspects of the invention are described herein with reference to flowchart illustrations and/or block diagrams of methods, apparatus (systems), and computer program products according to embodiments of the invention. Each block of the flowchart illustrations and/or block diagrams, and combinations of blocks in the flowchart illustrations and/or block diagrams, can be implemented by computer readable program instructions.

These computer-readable program instructions may be provided to a processor of a general-purpose computer, special purpose computer, or other programmable data processing apparatus to produce a machine, such that the instructions, which execute via the processor of the computer, create means for implementing the functions/acts specified in the flowchart and/or block diagram blocks. These computer-readable program instructions may also be stored in a computer-readable storage medium that can direct a computer to function in a particular manner, such that the computer-readable storage medium having instructions stored therein comprises an article of manufacture including instructions which implement aspects of the function/act specified in the flowchart and/or block diagram block or blocks.

The description of the present disclosure has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application and to enable others of ordinary skill in the art to understand the invention for various embodiments with various modifications as are suited to the particular use contemplated.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the invention.

What is claimed is:

1. A method for measuring energy cell impedance, the method comprising:
    generating a plurality of time sequences comprising:
        a time sequence representing a repetitive signal at a characterizing frequency;
        a time sequence representing an orthogonal-phase-repetitive signal at the characterizing frequency that is ninety degrees out of phase with the repetitive signal; and
        at least one time sequence corresponding to a respective term of a power series polynomial, each respective term of the power series polynomial having at least one respective exponential value;
    applying, to an energy cell, one of an electrical current or an electrical voltage corresponding to the time sequence representing the repetitive signal;
    measuring, contemporaneously with the applying, a time sequence of measured values of a response waveform corresponding to another of the electrical current or the electrical voltage across the energy cell;
    determining a set of correlation values comprising a respective correlation value between the time sequence of measured values and each of:
        the time sequence representing the repetitive signal;
        the time sequence representing the orthogonal-phase-repetitive signal; and
        the at least one time sequence corresponding to a respective term of a power series polynomial; and
    transforming the set of correlation values into a set of fitted coefficients comprising:
        a fitted repetitive coefficient corresponding to a magnitude of a repetitive signal component within the time sequence of measured values at the characterizing frequency; and
        a fitted orthogonal-phase-repetitive coefficient corresponding to a magnitude of an orthogonal-phase-repetitive signal component within the time sequence of measured values at the characterizing frequency that is ninety degrees out of phase with the repetitive signal component; and
    determining an impedance of the energy cell at the characterizing frequency based on a ratio of the fitted orthogonal-phase-repetitive coefficient to the fitted repetitive coefficient.

2. The method of claim 1, wherein the plurality of time sequences comprises a respective time sequence for each model signal of a plurality of model signals over a time duration, wherein transforming the set of correlation values comprises multiplying a vector comprising the set of correlation values by a transformation matrix wherein the transformation matrix comprises a symmetric and square matrix based on an inverse of a product of $(M^T \cdot M)$, where elements of the matrix $(M^T \cdot M)$ are based on values of the model signals.

3. The method of claim 2, wherein the matrix produced by $(M^T \cdot M)^{-1}$ comprises a sparse matrix and wherein the transformation matrix is a sparse matrix that is stored in a memory.

4. The method of claim 1, wherein the plurality of time sequences comprises a respective time sequence for each model signal of a plurality of model signals over a time duration, wherein generating the time sequences comprises generating a plurality of time sequences of model signals at different characterizing frequencies within a frequency range of interest, and
    wherein the applying, measuring, determining and transforming are performed based on each of the plurality of time sequences of model signals.

5. The method of claim 1, wherein the at least one time sequence corresponding to a respective term of a power series polynomial comprises a plurality of time sequences corresponding to a respective term of a power series polynomial.

6. The method of claim 5, where the plurality of time sequences corresponding to a respective term of a power series polynomial comprises at least a linear time sequence and a quadratic time sequence.

7. The method of claim 1, wherein at least one of the generating, applying, and measuring are performed by a resistive battery bleeder circuit connected to the energy cell.

8. The method of claim 1, wherein the plurality of time sequences comprises a respective time sequence for each model signal of a plurality of model signals over a time duration, wherein the time sequence representing the repetitive signal and the time sequence representing the orthogonal-phase-repetitive signal each comprise an integer number of cycles at the characterizing frequency within the time duration.

9. The method of claim 1, wherein:
    determining a set of correlation values further comprises determining correlation value between the time sequence of measured values and each of the at least one time sequence corresponding to a respective term of a power series polynomial, and
    wherein the set of fitted coefficients further comprises a respective fitted coefficient corresponding to each of the at least one time sequence corresponding to a respective term of a power series polynomial.

10. The method of claim 1, wherein:
    the time sequence corresponding to a respective term of a power series corresponds to a time sequence of a fit function represented by a Taylor series having N terms,
    wherein determining the set of correlation values further comprises determining a correlation value between the time sequence of measured values and a time sequence of sums of terms of the time sequence of the Taylor series, and wherein the set of fitted coefficients further comprises a fitted coefficient corresponding to the time sequence of the fit function represented by a Taylor series.

11. An energy cell complex impedance measurement apparatus, comprising:
a signal generator configured to, when operating:
generate a plurality of time sequences, comprising:
a time sequence representing a repetitive signal at a characterizing frequency;
a time sequence representing an orthogonal-phase-repetitive signal at the characterizing frequency that is ninety degrees out of phase with the repetitive signal; and
at least one time sequence corresponding to a respective term of a power series polynomial, each respective term of the power series polynomial having a respective exponential value;
apply, to an energy cell, one of an electrical current or an electrical voltage corresponding to the time sequence representing the repetitive signal;
a signal measurement component configured to, when operating, measure, contemporaneously with application of the one of the electrical current or the electrical voltage, a time sequence of measured values of a response waveform corresponding to an other of the electrical current or the electrical voltage across the energy cell;
a correlation processor configured to, when operating, determine a set of correlation values comprising a respective correlation value between the time sequence of measured values and each of:
the time sequence representing the repetitive signal;
the time sequence representing the orthogonal-phase-repetitive signal; and
the at least one time sequence corresponding to a respective term of a power series polynomial; and
a matrix multiply block configured to, when operating, transform the set of correlation values into a set of fitted coefficients comprising:
a fitted repetitive coefficient corresponding to a magnitude of a repetitive signal component within the time sequence of measured values at the characterizing frequency; and
a fitted orthogonal-phase-repetitive coefficient corresponding to a magnitude of an orthogonal-phase-repetitive signal component within the time sequence of measured values at the characterizing frequency that is ninety degrees out of phase with the repetitive signal component; and
an impedance calculator configured to, when operating, determining an impedance of the energy cell at the characterizing frequency based on a ratio of the fitted orthogonal-phase-repetitive coefficient to the fitted repetitive coefficient.

12. The apparatus of claim 11, wherein the plurality of time sequences comprises a respective time sequence for each model signal of a plurality of model signals over a time duration, wherein the matrix multiply block is configured to, when operating, transform the set of correlation values by at least multiplying a vector comprising the set of correlation values by a transformation matrix wherein the transformation matrix comprises a symmetric and square matrix based on the inverse of a product of $(M^T \cdot M)$, where elements of the matrix $(M^T \cdot M)$ are based on values of the model signals.

13. The apparatus of claim 12, wherein the matrix produced by $(M^T \cdot M)^{-1}$ comprises a sparse matrix and wherein the transformation matrix is a sparse matrix that is stored in a memory.

14. The apparatus of claim 11, wherein the plurality of time sequences comprises a respective time sequence for each model signal of a plurality of model signals over a time duration,
wherein the signal generator is further configured to, when operating:
generate the time sequences by at least generating a plurality of time sequences of model signals at different characterizing frequencies within a frequency range of interest; and
apply one of an electrical current or an electrical voltage based on each of the plurality of time sequences of model signals,
wherein the signal measurement component is further configured to, when operating, measure the time sequence of measured values based on each of the plurality of time sequences of model signals,
wherein the correlation processor is further configured to, when operating, determine the set of correlation values based on each of the plurality of time sequences of model signals, and
wherein the matrix multiply block is further configured to, when operating, transform the set of correlation values based on each of the plurality of time sequences of model signals.

15. The apparatus of claim 11, wherein the at least one time sequence corresponding to a respective term of a power series polynomial comprises a plurality of time sequences corresponding to a respective term of a power series polynomial.

16. The apparatus of claim 15, where the plurality of time sequences corresponding to a respective term of a power series polynomial comprises at least a linear time sequence and a quadratic time sequence.

17. The apparatus of claim 11, further comprising a resistive battery bleeder circuit connected to the energy cell, wherein the resistive battery bleeder circuit comprises at least one of the signal generator, the signal measurement component, the correlation processor, and the matrix multiply block.

18. The apparatus of claim 11, wherein the plurality of time sequences comprises a respective time sequence for each model signal of a plurality of model signals over a time duration, wherein the time sequence representing the repetitive signal and the time sequence representing the orthogonal-phase-repetitive signal each comprise an integer number of cycles at the characterizing frequency within the time duration.

19. The apparatus of claim 11:
wherein the correlation processor is configured to determine a set of correlation values by at least determining correlation values between the time sequence of measured values and each of the at least one time sequence corresponding to a respective term of a power series polynomial, and
wherein the set of fitted coefficients further comprises a respective fitted coefficient corresponding to each of the at least one time sequence corresponding to a respective term of a power series polynomial.

20. A computer program product for measuring energy cell impedance, the computer program product comprising:

a non-transitory computer-readable storage medium having computer-readable program code embodied therein configured to cause a computer to perform a method comprising:

generating a plurality of time sequences, comprising:
- a time sequence representing a repetitive signal at a characterizing frequency;
- a time sequence representing an orthogonal-phase-repetitive signal at the characterizing frequency that is ninety degrees out of phase with the repetitive signal; and
- at least one time sequence corresponding to a respective term of a power series polynomial, each respective term of the power series polynomial having a respective exponential value;

applying, to an energy cell, one of an electrical current or an electrical voltage corresponding to the time sequence representing the repetitive signal;

measuring, contemporaneously with the applying, a time sequence of measured values of a response waveform corresponding to another of the electrical current or the electrical voltage across the energy cell;

determining a set of correlation values comprising a respective correlation value between the time sequence of measured values and each of:
- the time sequence representing the repetitive signal;
- the time sequence representing the orthogonal-phase-repetitive signal; and
- the at least one time sequence corresponding to a respective term of a power series polynomial; and transforming the set of correlation values into a set of fitted coefficients comprising:
- a fitted repetitive coefficient corresponding to a magnitude of a repetitive signal component within the time sequence of measured values at the characterizing frequency; and
- a fitted orthogonal-phase-repetitive coefficient corresponding to a magnitude of an orthogonal-phase-repetitive signal component within the time sequence of measured values at the characterizing frequency that is ninety degrees out of phase with the repetitive signal component; and determining an impedance of the energy cell at the characterizing frequency based on a ratio of the fitted orthogonal-phase-repetitive coefficient to the fitted repetitive coefficient.

* * * * *